United States Patent
Nidhi et al.

(10) Patent No.: US 11,587,924 B2
(45) Date of Patent: Feb. 21, 2023

(54) INTEGRATION OF PASSIVE COMPONENTS IN III-N DEVICES

(71) Applicant: Intel Corporation, Santa Clara, CA (US)

(72) Inventors: Nidhi Nidhi, Hillsboro, OR (US); Rahul Ramaswamy, Portland, OR (US); Han Wui Then, Portland, OR (US); Marko Radosavljevic, Portland, OR (US); Johann Christian Rode, Hillsboro, OR (US); Paul B. Fischer, Portland, OR (US); Walid M. Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 822 days.

(21) Appl. No.: 16/362,269

(22) Filed: Mar. 22, 2019

(65) Prior Publication Data

US 2020/0303371 A1    Sep. 24, 2020

(51) Int. Cl.
| | | |
|---|---|---|
| *H01L 21/00* | (2006.01) | |
| *H01L 27/06* | (2006.01) | |
| *H01L 21/8252* | (2006.01) | |
| *H01L 27/01* | (2006.01) | |

(52) U.S. Cl.
CPC ...... *H01L 27/0629* (2013.01); *H01L 21/8252* (2013.01); *H01L 27/01* (2013.01)

(58) Field of Classification Search
CPC .. H01L 27/0629; H01L 21/8252; H01L 27/01
See application file for complete search history.

(56) References Cited

U.S. PATENT DOCUMENTS

| | | | | |
|---|---|---|---|---|
| 10,763,350 B2* | 9/2020 | Then | ............... | H01L 29/861 |
| 10,770,551 B2* | 9/2020 | Then | ............... | H01L 29/0847 |
| 10,804,214 B2* | 10/2020 | Then | ............... | H01L 28/40 |
| 10,811,526 B2* | 10/2020 | Then | ............... | H01L 29/7783 |
| 11,183,613 B2* | 11/2021 | Then | ............... | H01L 33/325 |
| 11,295,992 B2* | 4/2022 | Then | ............... | H01L 29/66462 |

(Continued)

FOREIGN PATENT DOCUMENTS

| | | | | |
|---|---|---|---|---|
| DE | 102020106493 A1 * | 10/2020 | ......... | H01L 29/2003 |
| DE | 102020108219 A1 * | 10/2020 | ......... | H01L 29/2003 |

(Continued)

*Primary Examiner* — Laura M Menz
(74) *Attorney, Agent, or Firm* — Akona IP PC

(57) ABSTRACT

Disclosed herein are integrated circuit structures, packages, and devices that include resistors and/or capacitors which may be provided on the same substrate/die/chip as III-N devices, e.g., III-N transistors. An integrated circuit structure, comprising a base structure comprising a III-N material, the base structure having a conductive region of a doped III-N material. The IC structure further comprises a first contact element, including a first conductive element, a dielectric element, and a second conductive element, wherein the dielectric element is between the first conductive element and the second conductive element, and wherein the first conductive element is between the conductive region and the dielectric element. The IC structure further comprises a second contact element electrically coupled to the first contact element via the conductive region.

14 Claims, 12 Drawing Sheets

(56) References Cited

U.S. PATENT DOCUMENTS

| | | | |
|---|---|---|---|
| 11,335,777 B2 * | 5/2022 | Lin | H01L 27/1203 |
| 11,355,505 B2 * | 6/2022 | Morris | G11C 11/221 |
| 11,380,679 B2 * | 7/2022 | Then | H03K 3/012 |
| 11,380,806 B2 * | 7/2022 | Gossner | H01L 29/778 |
| 11,387,328 B2 * | 7/2022 | Ramaswamy | H01L 27/088 |
| 11,387,329 B2 * | 7/2022 | Then | H01L 29/66469 |
| 2015/0236101 A1 * | 8/2015 | Chiang | H01L 29/205 |
| | | | 257/194 |
| 2019/0181099 A1 * | 6/2019 | Then | H01L 29/2003 |
| 2019/0221660 A1 * | 7/2019 | Dasgupta | H01L 29/517 |
| 2020/0279932 A1 * | 9/2020 | Nidhi | H01L 23/49844 |
| 2020/0294932 A1 * | 9/2020 | Then | H01L 23/552 |
| 2020/0303371 A1 * | 9/2020 | Nidhi | H01L 21/8252 |
| 2020/0312961 A1 * | 10/2020 | Then | H01L 27/0705 |
| 2020/0335526 A1 * | 10/2020 | Nidhi | H01L 27/092 |
| 2020/0335590 A1 * | 10/2020 | Nidhi | H01L 29/452 |
| 2020/0335592 A1 * | 10/2020 | Ramaswamy | H01L 29/66462 |
| 2020/0373297 A1 * | 11/2020 | Nidhi | H01L 25/0655 |
| 2020/0373421 A1 * | 11/2020 | Nidhi | H01L 29/7786 |
| 2020/0395358 A1 * | 12/2020 | Radosavljevic | H01L 29/2003 |
| 2020/0411677 A1 * | 12/2020 | Then | H01L 29/7787 |
| 2021/0005759 A1 * | 1/2021 | Then | H01L 27/0255 |
| 2021/0066184 A1 * | 3/2021 | Aleksov | H01L 24/85 |
| 2021/0066265 A1 * | 3/2021 | Eid | H01L 24/16 |
| 2021/0376135 A1 * | 12/2021 | Kwan | H01L 21/8252 |
| 2022/0068910 A1 * | 3/2022 | Then | H01L 29/205 |
| 2022/0093790 A1 * | 3/2022 | Glass | H01L 29/7816 |
| 2022/0102339 A1 * | 3/2022 | Then | H01L 29/205 |
| 2022/0102344 A1 * | 3/2022 | Then | H01L 29/7781 |

FOREIGN PATENT DOCUMENTS

| | | | | |
|---|---|---|---|---|
| WO | WO-2017099737 A1 * | 6/2017 | | H01L 29/1037 |
| WO | WO-2018004510 A1 * | 1/2018 | | H01L 21/8252 |
| WO | WO-2018004660 A1 * | 1/2018 | | H01L 29/2003 |
| WO | WO-2018063408 A1 * | 4/2018 | | H01L 27/0248 |
| WO | WO-2019066921 A1 * | 4/2019 | | H01L 33/0075 |
| WO | WO-2019066973 A1 * | 4/2019 | | H01L 29/0847 |

* cited by examiner

INTEGRATION OF PASSIVE COMPONENTS IN III-N DEVICES

BACKGROUND

As III-N semiconductor materials continue to develop, III-N devices have become potential candidates for high frequency applications, such as radio frequency (RF) applications, including, e.g., fifth generation (5G) cellular mobile communications. However, as the frequency of signals propagated through the integrated circuit (IC) structures that include III-N devices increase, the parasitic losses caused by the propagation through the IC structures increase and may cause significant amounts of power loss within the high frequency application.

Passive components play a role in in achieving high frequency performance. In legacy IC structures with III-N devices, the passive components were located off chip or multi-layer interconnect integration was implemented with the passive components located in upper metal layers. Routing to the off chip or passive components in the upper metal layers introduces parasitic losses due to the routing to the components that can cause significant power loss in the RF applications.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
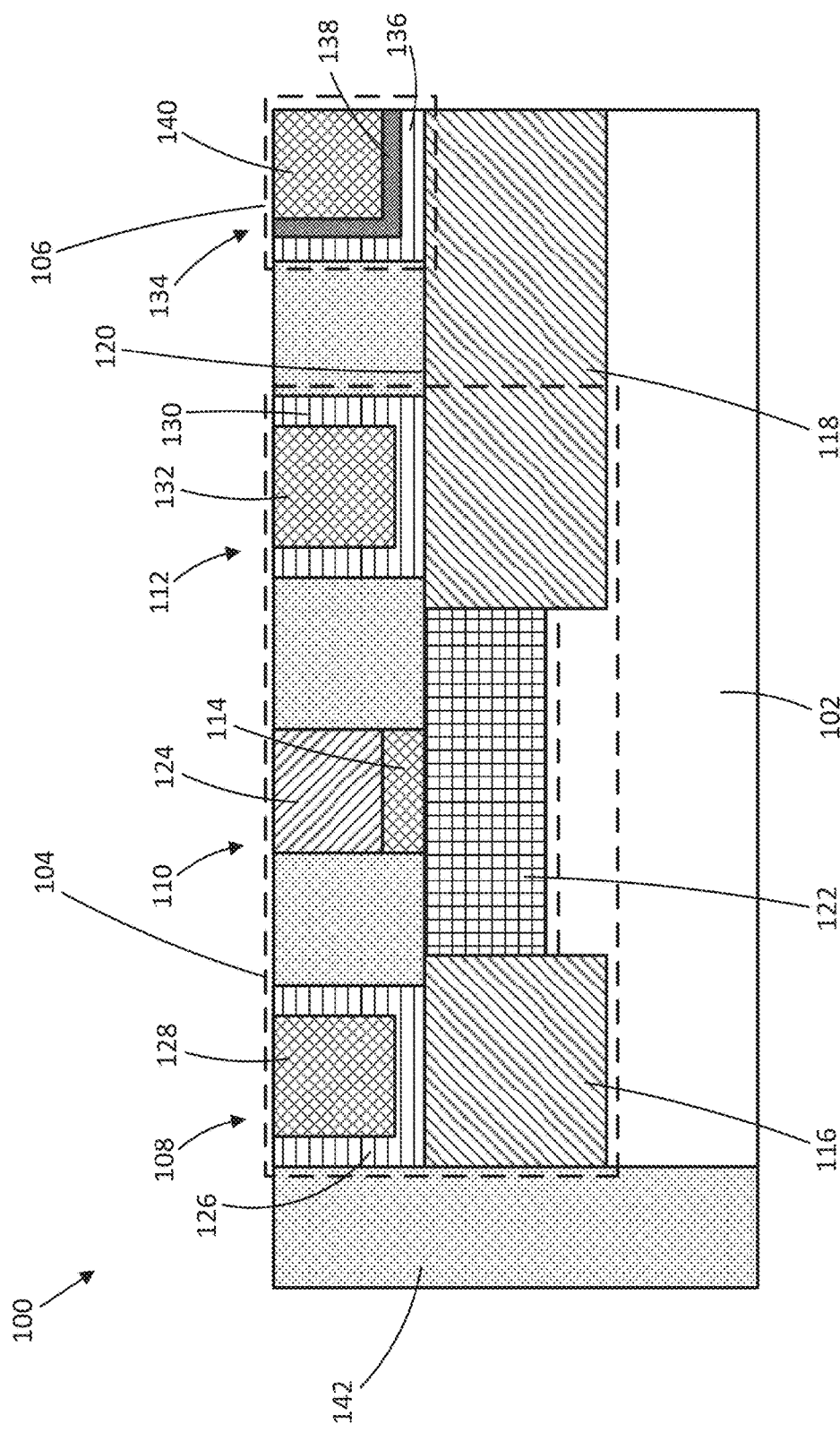
FIG. 1 illustrates a cross-sectional side view of an integrated circuit (IC) structure in accordance with any of the embodiments of the present disclosure.

Disclosed herein are IC structures, packages, and devices that include resistors and/or capacitors which may be provided on the same substrate/die/chip as III-N devices, e.g., III-N transistors. Because the capacitors and resistors are provided on the same substrate/die/chip as III-N devices, e.g., in a front-end structure, they may be referred to as "integrated." In particular, the integrated resistors and/or capacitors may be implemented in or on a base structure of IC structure, such as being a front-end structure produced through a front-end process. In some embodiments, the integrated resistors and/or capacitors may be implemented via a contact (which may be referred to as a contact element) located on a surface of the base structure. The integrated resistors and/or capacitors being implemented proximate to the base structure can avoid or reduce parasitic losses presented by legacy resistors and/or capacitors implemented in upper metal layers or off chip. An example IC structure includes an electrically conductive region (which may be referred to, simply, as a conductive region), a first contact element located on the conductive region, and a second contact element located on the conductive region. The second contact element includes an electrically conductive element (which may be referred to, simply, as a conductive element) and a dielectric element that separates the conductive element from the conductive region.

Each of the structures, packages, methods, devices, and systems of the present disclosure may have several innovative aspects, no single one of which being solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc. Similarly, the terms naming various compounds refer to materials having any combination of the individual elements within a compound (e.g., "gallium nitride" or "GaN" refers to a material that includes gallium and nitrogen, "aluminum indium gallium nitride" or "AlInGaN" refers to a material that includes aluminum, indium, gallium and nitrogen, and so on). Further, the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

As used herein, the term "III-N semiconductor material" (or, simply, "III-N material") refers to a compound semiconductor material with a first sub-lattice of at least one element from group III of the periodic table (e.g., Al, Ga, In) and a second sub-lattice of nitrogen (N). As used herein, the term "III-N transistor" refers to a field-effect transistor (FET) that includes a III-N material (which may include one or more different III-N materials, e.g., a plurality of different III-N materials stacked over one another) as an active material (i.e., the material in which a conducting channel of the transistor forms during operation, in which context the III-N material may also be referred to as a "III-N channel material"). As used herein, the term "III-N device" refers to a device component employing one or more III-N materials as active materials, The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 5A-5B, such a collection may be referred to herein without the letters, e.g., as "FIG. 5." In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

In the drawings, some schematic illustrations of example structures of various structures, devices, and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC structures that include at least one integrated resistor and/or integrated capacitor as described herein may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on an IC, provided as an integral part of an IC, or those connected to an IC. The IC may be either analog or digital and may be used in a number of applications, such as microprocessors, optoelectronics, logic blocks, audio amplifiers, etc., depending on the components associated with the IC. In some embodiments, IC structures as described herein may be included in a RFIC, which may, e.g., be included in any component associated with an IC of an RF receiver, an RF transmitter, or an RF transceiver, e.g., as used in telecommunications within base stations (BS) or user equipment (UE). Such components may include, but are not limited to, power amplifiers, low-noise amplifiers, RF filters (including arrays of RF filters, or RF filter banks), switches, upconverters, downconverters, and duplexers. In some embodiments, the IC structures as described herein may be employed as part of a chipset for executing one or more related functions in a computer.

Example Integrated Circuit Structures with Integrated Passive Components

FIG. 1 illustrates a cross-sectional side view of an IC structure 100 in accordance with any of the embodiments of the present disclosure. The IC structure 100 includes a III-N transistor 104 in series with an integrated capacitor 106. The IC structure 100 may comprise a front-end structure produced by a front-end fabrication process.

The IC structure 100 includes a base structure 102. The base structure 102 comprises a III-N material. For example, the base structure 102 may comprise a material of undoped, or of a relatively low dopant level (such as below $10^{15}$ dopants per cubic centimeter ($cm^{-3}$)), gallium and nitrogen in some embodiments, such as undoped gallium nitride or gallium nitride with a relatively low dopant level. In some embodiments, the base structure 102 may be formed with a first sub-lattice of at least one element from group III of the periodic table (e.g., aluminum (Al), gallium (Ga), indium (In)) and a second sub-lattice of nitrogen (N). Further, the base structure 102 may be a binary, ternary, or quaternary III-N material that is an alloy of two, three, or even four elements from group III of the periodic table (e.g., boron (B), Al, Ga, In) and N.

The IC structure 100 further includes a first doped region 116 and a second doped region 118. The first doped region 116 and the second doped region 118 may present a very low amount of resistance, and accordingly may be referred to as conductive regions. In instances where the first doped region 116 and/or the second doped region 118 are under a source contact element (such as the source contact element 108) or a drain contact element (such as the drain contact element 112) of a transistor, the first doped region 116 and/or the second doped region 118 may be referred to as a source region or a drain region, respectively. The first doped region 116 and the second doped region 118 may be formed of the same piece of material as the base structure 102. Accordingly, the first doped region 116 and the second doped region 118 may be a doped III-N material. The first doped region 116 and the second doped region 118 may have been doped to produce a p-type doped III-N material or a n-type doped III-N material. For example, the first doped region 116 and the second doped region 118 are n-type doped III-N material in the illustrated embodiment. The first doped region 116 and the second doped region 118 are located at an edge 120 of the piece of material of the base structure 102. The first doped region 116 and the second doped region 118 may be located some distance apart from each other.

The IC structure 100 further includes a polarization material 122. The polarization material 122 can present larger spontaneous and piezoelectric polarization, as compared to the III-N material of the base structure 102. The polarization material 122 may include Al, In, Ga, N, or some combination thereof. In some embodiments, the polarization material 122 includes material of the chemical makeup $Al_xIn_yGa_{1-x-y}N$, where x and y are variables. The polarization material 122 may comprise a material that has a lattice constant smaller than that of the III-N material of the base structure 102. The polarization material 122 may extend along the edge 120 and may extend between the first doped region 116 and the second doped region 118, where the polarization material 122 abuts (i.e., directly contacts) both the first doped region 116 and the second doped region 118.

The IC structure 100 further includes a source contact element 108, a gate stack 110, and a drain contact element 112. The source contact element 108 is located on the first doped region 116, the gate stack 110 is located on the polarization material 122, and the drain contact element 112 is located on the second doped region 118.

The gate stack 110 includes a dielectric region 114 located along the polarization material 122. The gate stack 110 further includes a conductive element 124 located on the dielectric region 114. The dielectric region 114 is located between the conductive element 124 and the polarization material 122. In some embodiments, the conductive element 124 may comprise a tungsten (W) contact material. Further, the conductive element 124 may form a contact of the gate stack 110. The dielectric region 114 separates the conductive element 124 from the polarization material 122.

The source contact element 108 and the drain contact element 112 each include a first conductive element and a second conductive element. In particular, the source contact element 108 includes a first conductive element 126 and a second conductive element 128, and the drain contact element 112 includes a first conductive element 130 and a second conductive element 132. The first conductive element 126 and the first conductive element 130 may include titanium (Ti), N, or some combination thereof. In particular, the first conductive element 126 and the first conductive element 130 may comprise titanium nitride in some embodiments. The second conductive element 128 and the second conductive element 132 may be the same conductive material as or may be a different conductive material than the first conductive element 126 and the first conductive element 130. For example, the first conductive element 126 and the first conductive element 130 may comprise a W contact material. The first conductive element 126 and the first conductive element 130 may form a contact of the source contact element 108 and the drain contact element 112, respectively.

The source contact element 108, the gate stack 110, the drain contact element 112, the first doped region 116, the polarization material 122, and the second doped region 118 form the transistor 104 in the IC structure 100. The transistor 104 comprises a metal-oxide-silicon field-effect transistor (MOSFET). The transistor 104 may be a n-type MOSFET or a p-type MOSFET in some embodiments. The transistor 104 may comprise a III-N transistor. Applying an electrical potential to the gate stack 110 may form a conductive channel associated with the polarization material 122. When the conductive channel is formed, current may flow between the source contact element 108 and the drain contact element 112.

The IC structure 100 further includes a contact element 134. The contact element 134 is located on the second doped region 118 and abuts the second doped region 118. The contact element 134 includes a first conductive element 136, a dielectric element 138, and a second conductive element 140. The first conductive element 136 abuts the second doped region 118 and couples the contact element 134 to the second doped region 118. The first conductive element 136 may be the same material as the first conductive element 126 and the first conductive element 130. Further, the second conductive element 140 may be the same material as the second conductive element 128 and the second conductive element 132. The second conductive element 140 may form a contact of the contact element 134.

The dielectric element 138 is located between the first conductive element 136 and the second conductive element 140. Further, the dielectric element 138 separates the first conductive element 136 and the second conductive element 140. The first conductive element 136 is located between the dielectric element 138 and the second doped region 118. The dielectric element 138 may be a uniform thickness (i.e., thickness of the dielectric element 138 has less than a 5 percent variance for an entirety of the dielectric element 138), and may provide a uniform distance of separation between the first conductive element 136 and the second conductive element 140. The separation of the first conductive element 136 and the second conductive element 140 by the dielectric element 138 causes the contact element 134 to act as the capacitor 106.

The dielectric element 138 may be selected based on desired capacitive properties of the capacitor 106. In particular, the capacitive properties of the capacitor 106 may be based on a thickness of the dielectric element 138, a chemical makeup of the dielectric element 138, or some combination thereof. For example, if a high capacitance of the capacitor 106 is desired, the dielectric element 138 may be selected to be a material having a high dielectric constant (k), such as titanium oxide, and/or hafnium dioxide. If a lower density capacitor with high breakdown value is desired, the dielectric element 138 may be selected to be silicon nitride, silicon dioxide, or some combination thereof.

The second doped region 118 couples the drain contact element 112 to the first conductive element 136 of the contact element 134. Accordingly, the drain contact element 112 of the transistor 104 is coupled in series with the first conductive element 136 of the capacitor 106 via the second doped region 118 in the illustrated embodiment. Thereby, the transistor 104 is coupled in series with the capacitor 106.

The IC structure 100 further includes dielectric region 142. The dielectric region 142 may be located on and/or between the elements to provide isolation between at least some of the elements. In particular, the dielectric region 142 may be located between the source contact element 108, the gate stack 110, the drain contact element 112, and the contact element 134, and may provide isolation between the elements.

While the capacitor 106 is illustrated coupled to the drain contact element 112 of the transistor 104 in the illustrated embodiment, it is to be understood that the capacitor 106 may be coupled to the source contact element 108 in other embodiments. For example, the contact element 134 may be located above and abut the first doped region 116 in other embodiments, where the first doped region 116 couples the contact element 134 to the source contact element 108. Further, it is to be understand that the contact element 134 may be located in different locations relative to the first doped region 116 and the second doped region in other embodiments. For example, the contact element 134 may located to the side of the second doped region 118 in other embodiments, where a conductive trace couples the contact element 134 to the second doped region 118. The conductive trace may comprise a portion of the first conductive element 136 in some embodiments.

Figure 2:
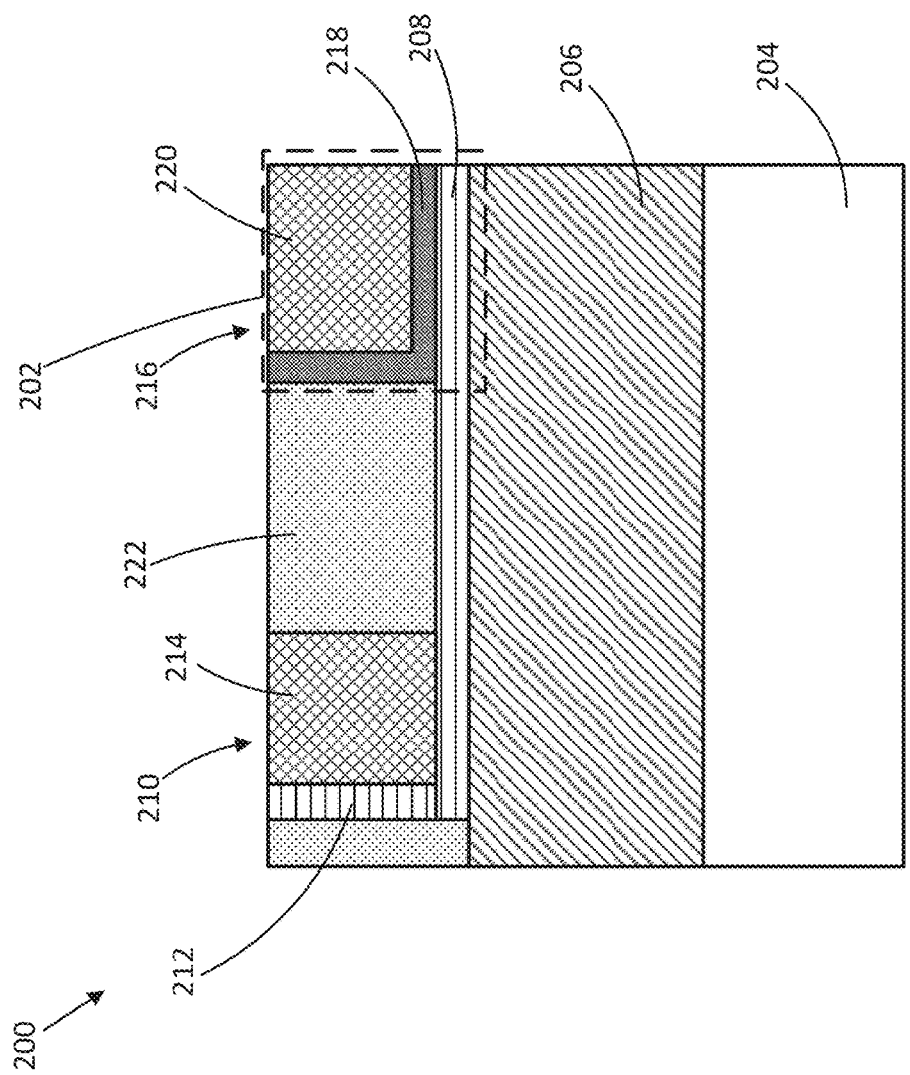
FIG. 2 illustrates a cross-sectional side view of another IC structure in accordance with any of the embodiments of the present disclosure.

FIG. 2 illustrates a cross-sectional side view of another IC structure 200 in accordance with any of the embodiments of the present disclosure. The IC structure 200 includes an integrated capacitor 202 in accordance with some embodiments. The IC structure 200 may comprise a front-end structure produced by a front-end fabrication process.

The IC structure 200 includes a base structure 204. The base structure 204 may include one or more of the features of the base structure 102 (FIG. 1). In particular, the base structure 204 comprises a III-N material. For example, the base structure 204 may comprise a material of undoped, or of a relatively low dopant level (such as below $10^{15}$ dopants per $cm^{-3}$), gallium and nitrogen in some embodiments, such as undoped gallium nitride or gallium nitride with a relatively low dopant level. In some embodiments, the base structure 204 may be formed with a first sub-lattice of at least one element from group III of the periodic table (e.g., Al, Ga, In) and a second sub-lattice of N. Further, the base structure 102 may be a binary, ternary, or quaternary III-N material that is an alloy of two, three, or even four elements from group III of the periodic table (e.g., B, Al, Ga, In) and N.

The IC structure 200 further includes a doped region 206. The doped region 206 may include one or more of the features of the first doped region 116 (FIG. 1) and/or the second doped region 118 (FIG. 1). The doped region 206 may present a very low amount of resistance, and may be referred to as a conductive region. In instances where the doped region 206 is located below a source contact element (such as the source contact element 108 (FIG. 1)) or a drain contact element (such as the drain contact element 112 (FIG. 1)) of a transistor, the doped region 206 may be referred to as a source region or a drain region, respectively. The doped region 206 may be formed of the same piece of material as the base structure 204. Accordingly, the doped region 206 may be a doped III-N material. The doped region 206 may be have been doped to produce a p-type doped III-N material or a n-type doped III-N material. For example, the doped region 206 is a n-type doped III-N material in the illustrated embodiment.

The IC structure 200 further includes a conductive layer 208. The conductive layer 208 is located on the doped region 206 on a side of the doped region 206 opposite to the base structure 204. The conductive layer 208 may extend for a portion of the area of the doped region 206. Further, the conductive layer 208 is a uniform thickness is some embodiments. The conductive layer 208 may include Ti, N, or some combination thereof. In some embodiments, the conductive layer 208 may comprise titanium nitride.

The IC structure 200 further includes a contact element 210. The contact element 210 is located on the conductive layer 208 and abuts the conductive layer 208. Further, the conductive layer 208 is located between the contact element 210 and the doped region 206. The contact element 210 may include a first conductive element 212 and a second conductive element 214. The first conductive element 212 may be a same material as the conductive layer 208. The second conductive element 214 may comprise a W contact material. Further, the second conductive element 214 may form a contact of the contact element 210. In the illustrated embodiment, the first conductive element 212 extends along one side of the second conductive element 214. In other embodiments, the first conductive element 212 may extend along all sides of the second conductive element 214, along some portion of the sides of the second conductive element 214, and/or may extend between the second conductive element 214 and the conductive layer 208. In other embodiments, the first conductive element 212 may be omitted.

The IC structure 200 further includes another contact element 216. The contact element 216 is located on the conductive layer 208 and abuts the conductive layer 208. The conductive layer 208 is located between the contact element 216 and the doped region 206. The contact element 216 includes a dielectric element 218 and a conductive element 220. The dielectric element 218 abuts the conductive layer 208 and separates the conductive element 220 from the conductive layer 208. Further, the dielectric element 218 is located between the conductive element 220 and the conductive layer 208. In the illustrated embodiment, the dielectric element 218 extends along a side of the conductive element 220 and between the conductive element 220 and the conductive layer 208. In other embodiments, the dielectric element 218 may extend between the conductive element 220 and the conductive layer 208, and along all the sides of the conductive element 220 or along a portion of the sides of the conductive element 220. The dielectric element 218 may be a uniform thickness (i.e., the thickness of the dielectric element 218 has less than a 5 percent variance for an entirety of the dielectric element 218), and may provide a uniform distance of separation between the conductive element 220 and the conductive layer 208. Further, the contact element 216 may include a second conductive element (such as the first conductive element 136 (FIG. 1)) in some embodiments, where the second conductive element may extend between the dielectric element 218 and the conductive layer 208 and/or along one or more of the sides of the dielectric element 218.

The conductive element 220 may comprise a W contact material. Further, the conductive element 220 may form a contact of the contact element 216. The conductive element 220, the dielectric element 218, and the portion of the conductive layer 208 located adjacent to the contact element 216 forms the capacitor 202. In particular, the separation of the conductive element 220 and the conductive layer 208 by the dielectric element 218 causes the contact element 216 and the portion of the conductive layer 208 to act as the capacitor 202.

The dielectric element 218 may be selected based on desired capacitive properties of the capacitor 202. In particular, the capacitive properties of the capacitor 202 may be based on a thickness of the dielectric element 218, a chemical makeup of the dielectric element 218, or some combination thereof. For example, if a high capacitance of the capacitor 202 is desired, the dielectric element 218 may be selected to be a material having a high dielectric constant (k), such as a material that includes titanium and oxygen or a material that includes hafnium and oxygen, including titanium oxide, and/or hafnium dioxide. If a lower density capacitor with high breakdown value is desired, the dielectric element 218 may be selected to be a material that includes silicon, nitrogen, oxygen, or some combination thereof, including silicon nitride and/or silicon dioxide.

The conductive layer 208 and the doped region 206 couple the contact element 210 and the contact element 216. The second conductive element 214 of the contact element 210 forms one contact of the capacitor 202 and the conductive element 220 of the contact element 216 forms another contact of the capacitor 202. In other embodiments, the contact element 210 may be a contact element of another electrical element of the IC structure 100, where the contact element is coupled in series with the capacitor 202. For example, the contact element 210 may comprise a source contact element or a drain contact element of a transistor, such as the transistor 104 (FIG. 1).

The IC structure 200 further includes dielectric region 222. The dielectric region 222 may be located on and/or between the elements to provide isolation between at least some of the elements. In particular, the dielectric region 222 may be located between the contact element 210 and the contact element 216 and may provide isolation between the contact element 210 and the contact element 216.

In other embodiments, the doped region 206 may be omitted. In these embodiments, the conductive layer 208 may be located on the base structure 204, or the doped region 206 may be replaced by a dielectric region, where the conductive layer 208 is located on the dielectric region. In these embodiments, the contact element 210 and the contact element 216 may be coupled by only the conductive layer 208. Further, the conductive layer 208 may act as a resistor in these embodiments. In particular, the conductive layer 208 may provide resistance between the contact element 210 and the contact element 216, where the distance between the contact element 210 and the contact element 216 and/or a thickness of the conductive layer 208 can determine the amount of resistance provided by the conductive layer 208. The further the distance between the contact element 210 and the contact element 216, the higher the resistance provided by the conductive layer 208. Accordingly, the IC structure 200 may include the capacitor 202 and an integrated resistor (formed by the conductive layer 208) in these embodiments.

Figure 3:
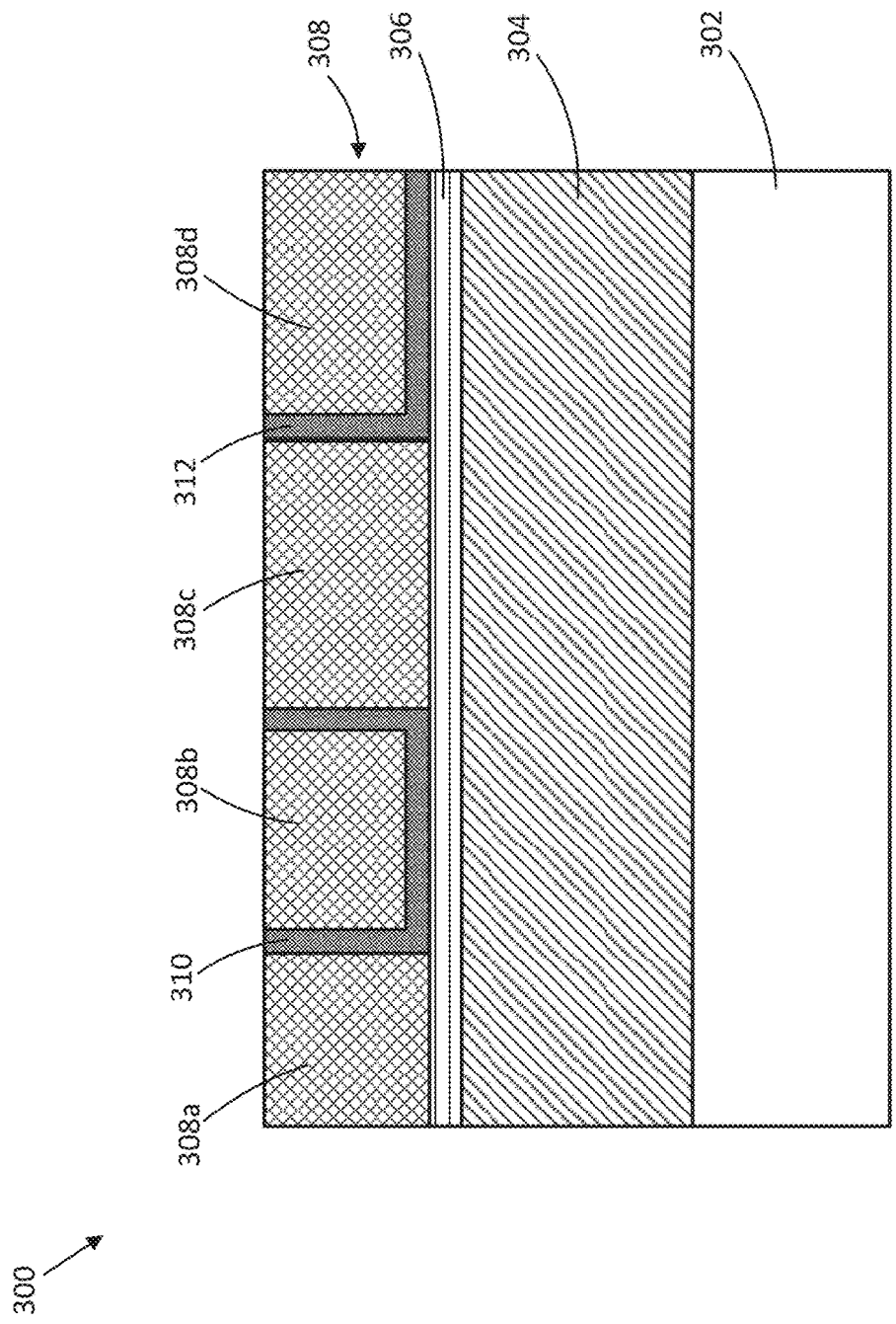
FIG. 3 illustrates a cross-sectional side view of another IC structure in accordance with any of the embodiments of the present disclosure.

FIG. 3 illustrates a cross-sectional side view of another IC structure 300 in accordance with any of the embodiments of the present disclosure. The IC structure 300 includes a plurality of capacitors. In particular, the IC structure 300 may comprise a high density capacitor array. The IC structure 300 may comprise a front-end structure produced by a front-end fabrication process.

The IC structure 300 includes a base structure 302. The base structure 302 may include one or more of the features of the base structure 102 (FIG. 1). The base structure 302 comprises a III-N material. For example, the base structure 302 may comprise undoped gallium nitride or gallium nitride with a relatively low dopant level, such as below $10^{15}$ dopants per $cm^{-3}$ in some embodiments. In some embodiments, the base structure 302 may be formed with a first sub-lattice of at least one element from group III of the periodic table (e.g., Al, Ga, In) and a second sub-lattice of N. Further, the base structure 302 may be a binary, ternary, or quaternary III-N material that is an alloy of two, three, or even four elements from group III of the periodic table (e.g., B, Al, Ga, In) and N.

The IC structure 300 further includes a doped region 304. The doped region 304 may include one or more of the features of the first doped region 116 (FIG. 1) and/or the second doped region 118 (FIG. 1). The doped region 304 may present a very low amount of resistance, and may be referred to as a conductive region. In instances where the doped region 304 is located below a source contact element (such as the source contact element 108 (FIG. 1)) or a drain contact element (such as the drain contact element 112 (FIG. 1)) of a transistor, the doped region 304 may be referred to as a source region or a drain region, respectively. Further, the doped region 304 may be formed of the same piece of material as the base structure 302. Accordingly, the doped region 304 may be a doped III-N material. The doped region 304 may been doped to produce a p-type doped III-N material or a n-type doped III-N material. For example, the doped region 304 is a n-type doped III-N material in the illustrated embodiment.

The IC structure 300 further includes a conductive layer 306. The conductive layer 306 is located on the doped region 304 on a side of the doped region 304 opposite to the base structure 302. The conductive layer 306 may extend for at least a portion of the area of the doped region 304. Further, the conductive layer 306 is a uniform thickness (i.e., thickness of the conductive layer 306 has less than a 5 percent variance for an entirety of the conductive layer 306) is some embodiments. The conductive layer 306 may include Ti, N, or some combination thereof. In some embodiments, the conductive layer 306 may comprise titanium nitride.

The IC structure 300 further includes a plurality of contacts 308. The conductive layer 306 is located between the plurality of contacts 308 and the doped region 304. For example, the IC structure 300 illustrated includes a first contact 308a, a second contact 308b, a third contact 308c, and a fourth contact 308d. In other embodiments, the plurality of contacts 308 may include more or fewer contacts than the illustrated embodiment. Each contact of the plurality of contacts 308 comprise a conductive element. For example, each contact may include a W contact material comprising a conductive element. The plurality of contacts 308 may be located on the conductive layer 306.

The IC structure 300 further includes one or more dielectric regions interspersed within the plurality of contacts 308. Each dielectric region separates a corresponding contact of the plurality of contacts 308 from other contacts and the conductive layer 306. For example, a dielectric region is located between the corresponding contact and other contacts, and between the corresponding contact and the conductive layer 306. A first portion of the dielectric region can be located between the corresponding contact and the other contacts, and a second portion of the dielectric region can be located between the corresponding contact and the conductive layer 306. The IC structure 300 includes a first dielectric element 310 and a second dielectric element 312 in the illustrated embodiment. The first dielectric element 310 corresponds to the second contact 308b and the second dielectric element 312 corresponds to the fourth contact 308d. In particular, the first dielectric element 310 extends around the sides of the second contact 308b and between the second contact 308b and the conductive layer 306 to separate the second contact 308b from the other contacts and the conductive layer 306. Further, the second dielectric element 312 extends arounds at least a portion of the sides of the fourth contact 308d and between the fourth contact 308d and the conductive layer 306 to separate the fourth contact 308d from the other contacts and the conductive layer 306. An amount of sides that dielectric elements extend around the corresponding contact may differ as long as the dielectric element separates the corresponding contact from the other contacts and the conductive layer 306. The thickness of each of the dielectric elements may be uniform thicknesses (i.e., thicknesses of the dielectric elements have less than a 5 percent variance for an entirety of the dielectric elements). Further, the thickness of each of the dielectric elements may the same as the thickness of the other dielectric elements or may be different from a portion of the thicknesses of the dielectric elements. For example, the first dielectric element 310 may be the same thickness as or may be a different thickness from the second dielectric element 312.

A capacitor of the IC structure 300 is formed by a dielectric element, a corresponding contact, and a conductive material (which may be metal) on the opposite side of the dielectric element from the corresponding contact. For example, the first contact 308a, the first dielectric element 310, and the second contact 308b may form a capacitor. Further, the fourth contact 308d, the second dielectric element 312, and the conductive layer 306 may form a capacitor. Contacts for a capacitor may include one of the plurality of contacts 308 not separated by a dielectric element and another of the plurality of contacts 308 that is separated by a dielectric element. In the illustrated embodiment, four different capacitors may be formed based on which contacts to which external elements are coupled. In particular, a first capacitor may be formed by coupling to the first contact 308a (which is not separated by a dielectric element) and the second contact 308b (which is separated by the first dielectric element 310). A second capacitor may be formed by coupling to the third contact 308c and the fourth contact 308d. A third capacitor may be formed by coupling to the first contact 308a and the fourth contact 308d. A fourth capacitor may be formed by coupling to the second contact 308b and the third contact 308c.

The material of each of the dielectric elements may be selected based on desired capacitive properties of each of the capacitors. Each of the dielectric elements may comprise the same material as or different material from each of the other dielectric elements. For example, the first dielectric element 310 may be the same material as or a different material from the second dielectric element 312. The capacitive properties of each of the capacitors may be based on a thickness of the dielectric material of the capacitor, a chemical makeup of the dielectric material of the capacitor, or some combination thereof. Each of the capacitors formable within the IC structure 300 may have the same capacitive properties as or different capacitive properties from the other capacitors formable within the IC structure 300. If a high capacitance of a capacitor is desired, the dielectric material for the capacitor may be selected to be a material having a high-k, such as a material that includes titanium and oxygen or hafnium and oxide, including titanium oxide, and/or hafnium dioxide. If a lower density capacitor with high breakdown value is desired, the dielectric material for the capacitor may be selected to be a material that includes silicon, nitrogen, oxygen, or some combination thereof, including silicon nitride and/or silicon dioxide.

Figure 4:
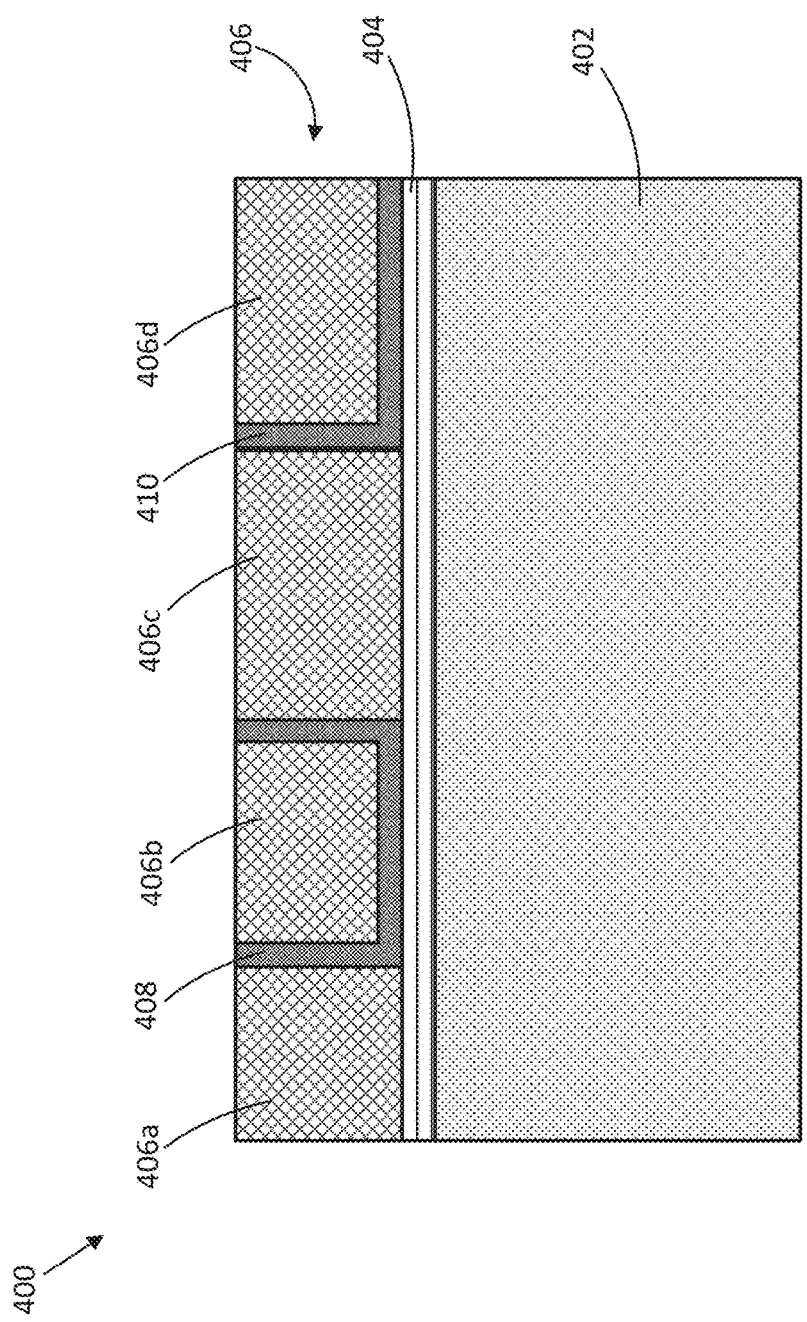
FIG. 4 illustrates a cross-sectional side view of another IC structure in accordance with any of the embodiments of the present disclosure.

FIG. 4 illustrates a cross-sectional side view of another IC structure 400 in accordance with any of the embodiments of the present disclosure. The IC structure 400 includes a plurality of capacitors. In particular, the IC structure 400 may comprise a high density capacitor array. The IC structure 400 may comprise a front-end structure produced by a front-end fabrication process.

The IC structure 400 includes a dielectric region 402. The dielectric region 402 comprises a dielectric material. The IC structure 400 further includes a conductive layer 404 located on the dielectric region 402. The conductive layer 404 may include one or more of the features of the conductive layer 306 (FIG. 3). The conductive layer 404 may extend for at least a portion of the area of the dielectric region 402. Further, the conductive layer 404 is a uniform thickness (i.e., the thickness of the conductive layer 404 has less than a 5 percent variance for an entirety of the conductive layer 404) is some embodiments. The conductive layer 404 may include Ti, N, or some combination thereof. In some embodiments, the conductive layer 404 may comprise titanium nitride.

The IC structure 400 further includes a plurality of contacts 406. The conductive layer 404 is located between the plurality of contacts 406 and the dielectric region 402. The plurality of contacts 406 may include one or more of the features of the plurality of contacts 308 (FIG. 3). The IC structure 400 illustrated includes a first contact 406a, a second contact 406b, a third contact 406c, and a fourth contact 406d. In other embodiments, the plurality of contacts 406 may include more or fewer contacts than the illustrated embodiment. Each contact of the plurality of contacts 406 comprise a conductive element. For example, each contact may include a W contact material comprising a conductive element. The plurality of contacts 406 may be located on the conductive layer 404.

The IC structure 400 further includes one or more dielectric elements interspersed within the plurality of contacts 406. Each dielectric element separates a corresponding contact of the plurality of contacts 406 from other contacts and the conductive layer 404. For example, a dielectric region is located between the corresponding contact and other contacts, and between the corresponding contact and the conductive layer 404. A first portion of the dielectric region can be located between the corresponding contact and the other contacts, and a second portion of the dielectric region can be located between the corresponding contact and the conductive layer 404. The IC structure 400 includes a first dielectric element 408 and a second dielectric element 410 in the illustrated embodiment. The first dielectric element 408 corresponds to the second contact 406b and the second dielectric element 410 corresponds to the fourth contact 406d. In particular, the first dielectric element 408 extends around the sides of the second contact 406b and between the second contact 406b and the conductive layer 404 to separate the second contact 406b from the other contacts and the conductive layer 404. Further, the second dielectric element 410 extends arounds at least a portion of the sides of the fourth contact 406d and between the fourth contact 406d and the conductive layer 404 to separate the fourth contact 406d from the other contacts and the conductive layer 404. An amount of sides that dielectric elements extend around the corresponding contact may differ as long as the dielectric element separates the corresponding contact from the other contacts and the conductive layer 404. The thickness of each of the dielectric elements may be uniform thicknesses (i.e., thicknesses of the dielectric elements have less than a 5 percent variance for an entirety of the dielectric elements). Further, the thickness of each of the dielectric elements may the same as the thickness of the other dielectric elements or may be different from a portion of the thicknesses of the dielectric elements. For example, the first dielectric element 408 may be the same thickness as or may be a different thickness from the second dielectric element 410.

A capacitor of the IC structure 400 is formed by a dielectric element, a corresponding contact, and a conductive material (which may be metal) on the opposite side of the dielectric element from the corresponding contact. For example, the first contact 406a, the first dielectric element 408, and the second contact 406b may form a capacitor. Further, the fourth contact 406d, the second dielectric element 410, and the conductive layer 404 may form a capacitor. Contacts for a capacitor may include one of the plurality of contacts 406 not separated by a dielectric element and another of the plurality of contacts 406 that is separated by a dielectric element. In the illustrated embodiment, four different capacitors may be formed based on which contacts to which external elements are coupled. In particular, a first capacitor may be formed by coupling to the first contact 406a (which is not separated by a dielectric element) and the second contact 406b (which is separated by the first dielectric element 408). A second capacitor may be formed by coupling to the third contact 406c and the fourth contact 406d. A third capacitor may be formed by coupling to the first contact 406a and the fourth contact 406d. A fourth capacitor may be formed by coupling to the second contact 406b and the third contact 406c.

The material of each of the dielectric elements may be selected based on desired capacitive properties of each of the capacitors. Each of the dielectric elements may comprise the same material as or different material from each of the other dielectric elements. For example, the first dielectric element 408 may be the same material as or a different material from the second dielectric element 410. The capacitive properties of each of the capacitors may be based on a thickness of the dielectric material of the capacitor, a chemical makeup of the dielectric material of the capacitor, or some combination thereof. Each of the capacitors formable within the IC structure 400 may have the same capacitive properties as or different capacitive properties from the other capacitors formable within the IC structure 400. If a high capacitance of a capacitor is desired, the dielectric material for the capacitor may be selected to be a material having a high-k, such as a material including titanium and oxygen or hafnium and oxygen, including titanium oxide, and/or hafnium dioxide. If a lower density capacitor with high breakdown value is desired, the dielectric material for the capacitor may be selected to be a material including silicon, nitrogen, oxygen, or some combination thereof, such as silicon nitride and/or silicon dioxide.

In the case of the capacitor formed by coupling to the first contact 406a and the fourth contact 406d, the conductive layer 404 may couple the first contact 406a with the second dielectric element 410. The fourth contact 406d, the second dielectric element 410, and the portion of the conductive layer 404 adjacent to second dielectric element 410 form the capacitor. Another portion of the conductive layer 404 extending from the first contact 406a to the second dielectric element 410 may act as a resistor coupled in parallel with the capacitor. In particular, the conductive layer 404 may have some resistance, where a distance between the first contact 406a and the second dielectric element 410 and/or a thickness of the conductive layer 404 may define a resistance between the first contact 406a and the second dielectric element 410.

Figure 5:
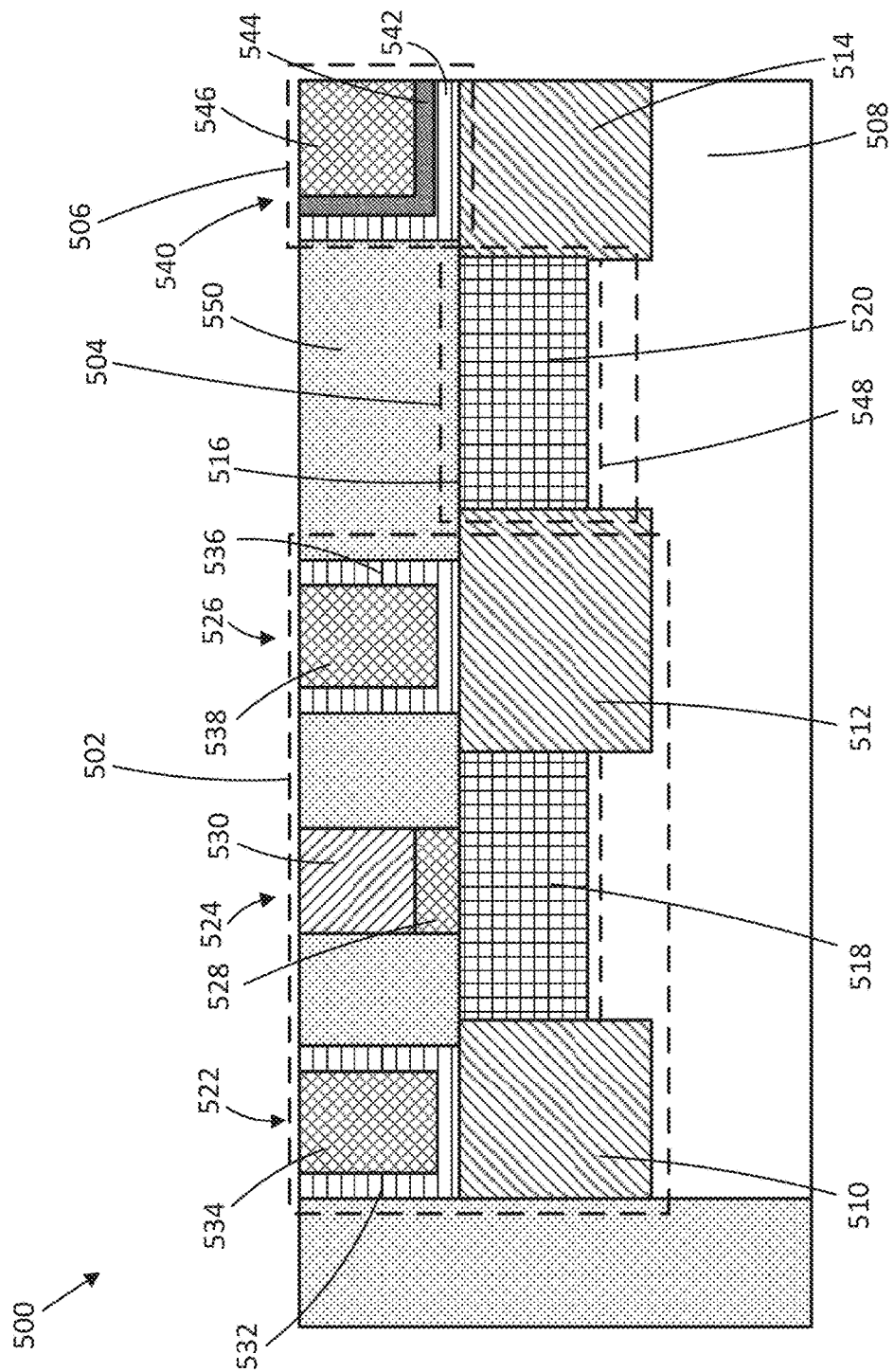
FIG. 5 illustrates a cross-sectional side view of another IC structure in accordance with any of the embodiments of the present disclosure.

FIG. 5 illustrates a cross-sectional side view of another IC structure 500 in accordance with any of the embodiments of the present disclosure. The IC structure 500 includes a transistor 502 in series with an integrated resistor 504 and an integrated capacitor 506. The transistor 502 may comprise a III-N transistor 502. The IC structure 500 may comprise a front-end structure produced by a front-end fabrication process.

The IC structure 500 includes a base structure 508. The base structure 508 may include one or more of the features of the base structure 102. The base structure 508 comprises a III-N material. For example, the base structure 508 may comprise a material of undoped, or of a relatively low dopant level (such as below 1015 dopants per $cm^{-3}$), gallium and nitrogen in some embodiments, such as undoped gallium nitride or gallium nitride with the relatively low dopant level. In some embodiments, the base structure 508 may be formed with a first sub-lattice of at least one element from group III of the periodic table (e.g., Al, Ga, In) and a second sub-lattice of N. Further, the base structure 508 may be a binary, ternary, or quaternary III-N material that is an alloy of two, three, or even four elements from group III of the periodic table (e.g., B, Al, Ga, In) and N.

The IC structure 500 further includes a first doped region 510, a second doped region 512, and a third doped region 514. The first doped region 510, the second doped region 512, and the third doped region 514 may present a very low amount of resistance, and may be referred to as conductive regions. In instances where the first doped region 510, the second doped region 512, and/or the third doped region 514 is located below a source contact element (such as the source contact element 522) or a drain contact element (such as the drain contact element 526) of a transistor, the first doped region 510, the second doped region 512, and/or the third doped region 514 may be referred to as a source region or a drain region, respectively. The first doped region 510, the second doped region 512, and the third doped region 514 may be formed of the same piece of material as the base structure 508. Accordingly, the first doped region 510, the second doped region 512, and the third doped region 514 may be a doped III-N material. The first doped region 510, the second doped region 512, and the third doped region 514 may be doped to become a p-type doped III-N material or a n-type doped III-N material. For example, the first doped region 510, the second doped region 512, and the third doped region 514 are illustrated as n-type doped III-N material in the illustrated embodiment. The first doped region 510, the second doped region 512, and the third doped region 514 are located at an edge 516 of the piece of material. The first doped region 510, the second doped region 512, and the third doped region 514 may be located some distance apart from each other.

The IC structure 500 further includes a first polarization material 518 and a second polarization material 520. The first polarization material 518 and the second polarization material 520 may include Al, In, Ga, N, or some combination thereof. In some embodiments, the first polarization material 518 and the second polarization material 520 includes material of the chemical makeup $Al_xIn_yGa_{1-x-y}N$, where x and y are variables. In other embodiments, the first polarization material 518 and the second polarization material 520 may be different materials with different chemical makeups based on the doping levels of the first polarization material 518 and the second polarization material 520. The first polarization material 518 and the second polarization material 520 may comprise polarization material that has a lattice constant smaller than that of the III-N material. The first polarization material 518 extends along the edge 516 and extends between the first doped region 510 and the second doped region 512, where the first polarization material 518 abuts both the first doped region 510 and the second doped region 512. The second polarization material 520 extends along the edge 516 and extends between the second doped region 512 and the third doped region 514, where the second polarization material 520 abuts both the second doped region 512 and the third doped region 514.

The IC structure 500 further includes a source contact element 522, a gate stack 524, and a drain contact element 526. The source contact element 522 is located on the first doped region 510, the gate stack 524 is located on the first polarization material 518, and the drain contact element 526 is located on the second doped region 512.

The gate stack 524 may include one or more of the features of the gate stack 110 (FIG. 1). The gate stack 524 includes a dielectric region 528 located along the first polarization material 518. The gate stack 524 further includes a conductive element 530 located on the dielectric region 528. The dielectric region 528 is located between the first polarization material 518 and the conductive element 530. In some embodiments, the conductive element 530 may comprise a W contact material. Further, the conductive element 530 may form a contact of the gate stack 524. The dielectric region 528 separates the conductive element 530 from the first polarization material 518.

The source contact element 522 and the drain contact element 526 each include a first conductive element and a second conductive element. In particular, the source contact element 522 includes a first conductive element 532 and a second conductive element 534, and the drain contact element 526 includes a first conductive element 536 and a second conductive element 538. The first conductive element 532 and the first conductive element 536 may include Ti, N, or some combination thereof. In particular, the first conductive element 532 and the first conductive element 536 may comprise titanium nitride in some embodiments. The second conductive element 534 and the second conductive element 538 may be the same conductive material as or may be a different conductive material than the first conductive element 532 and the first conductive element 536. For example, the first conductive element 532 and the first conductive element 536 may comprise a W contact material. The first conductive element 532 and the first conductive element 536 may form a contact of the source contact element 522 and the drain contact element 526, respectively.

The source contact element 522, the gate stack 524, the drain contact element 526, the first doped region 510, the first polarization material 518, and the second doped region 512 form the transistor 502 in the IC structure 500. The transistor 502 comprises a MOSFET. The transistor 502 may be a n-type MOSFET or a p-type MOSFET in some embodiments. Applying an electrical potential to the gate stack 524 may form a channel in the first polarization material 518. When the channel is formed within the first polarization material 518, current may flow between the source contact element 522 and the drain contact element 526.

The IC structure 500 further includes a contact element 540. The contact element 540 is located on the third doped region 514 and abuts the third doped region 514. The third doped region 514 is located between the contact element 540 and the base structure 508. The contact element 540 includes a first conductive element 542, a dielectric element 544, and a second conductive element 546. The first conductive element 542 abuts the third doped region 514 and couples the contact element 540 to the third doped region 514. The first conductive element 542 may be the same material as the first conductive element 532 and the first conductive element 536. Further, the second conductive element 546 may be the same material as the second conductive element 534 and the second conductive element 538. The second conductive element 546 may form a contact of the contact element 540.

The dielectric element 544 separates the first conductive element 542 and the second conductive element 546. For example, the dielectric element 544 is located between the first conductive element 542 and the second conductive element 546. Further, the first conductive element 542 is located between the dielectric element 544 and the third doped region 514. The dielectric element 544 may be a uniform thickness (i.e., the thickness of the dielectric element 544 has less than a 5 percent variance for an entirety of the dielectric element 544), and may provide a uniform distance of separation between the first conductive element 542 and the second conductive element 546. The separation of the first conductive element 542 and the second conductive element 546 by the dielectric element 544 causes the contact element 540 to act as the capacitor 506.

The dielectric element 544 may be selected based on desired capacitive properties of the capacitor 506. In particular, the capacitive properties of the capacitor 506 may be based on a thickness of the dielectric element 544, a chemical makeup of the dielectric element 544, or some combination thereof. For example, if a high capacitance of the capacitor 506 is desired, the dielectric element 544 may be selected to be a material having a high dielectric constant (k), such as a material including titanium and oxygen or hafnium and oxygen, including titanium oxide, and/or hafnium dioxide. If a lower density capacitor with high breakdown value is desired, the dielectric element 544 may be selected to be a material including silicon, nitrogen, oxygen, or some combination thereof, such as silicon nitride and/or silicon dioxide.

The second polarization material 520 couples the second doped region 512 and the third doped region 514. The second polarization material 520 may act as the resistor 504 coupling the transistor 502 and the capacitor 506. The second polarization material 520 has two-dimensional electron gas 548 (illustrated as a dotted line). In particular, the polarization material of the second polarization material 520 can cause formation of the two-dimensional electron gas 548 in the base structure 508. As a potential is applied between the second doped region 512 and the third doped region 514, the two-dimensional electron gas 548 facilitates current flow between the second doped region 512 and the third doped region 514, where the two-dimensional electron gas 548 presents resistance to the current flowing via the two-dimensional electron gas 548. The resistance presented by the two-dimensional electron gas 548 may be based on a chemical makeup of the second polarization material 520, a length of the second polarization material 520, a thickness of the second polarization material 520, or some combination thereof. The resistor 504 produced by the second polarization material 520 could have a temperature coefficient similar to the transistor 502. Accordingly, the resistor 504 could follow any changes in the performance of the transistor 502.

The IC structure 500 further includes dielectric region 550. The dielectric region 550 may be located on and/or between the elements to provide isolation between at least some of the elements. In particular, the dielectric region 550 may be located between the source contact element 522, the gate stack 524, the drain contact element 526, and the contact element 540, and may provide isolation between the elements.

While the capacitor 506 is illustrated coupled to the drain contact element 526 of the transistor 502 via the resistor 504 in the illustrated embodiment, it is to be understood that the capacitor 506 may be coupled to the source contact element 522 via the resistor 504 in other embodiments. For example, the third doped region 514 with the contact element 540 may be located on an opposite side of the first doped region 510 from the second doped region 512 and the second polarization material 520 may extend between the third doped region 514 and the first doped region 510. Further, the capacitor 506 may be omitted in other embodiments. In these embodiments, the contact element 540 may be replaced by a contact element with the same configuration as the source contact element 522 and/or the drain contact element 526 (i.e., the replacement element may include a first conductive element abutting the third doped region 514 and a second conductive element on an opposite side of the first conductive element from the third doped region 514). In these embodiments, the IC structure 500 includes the transistor 502 coupled in series with the resistor 504.

Figure 6:
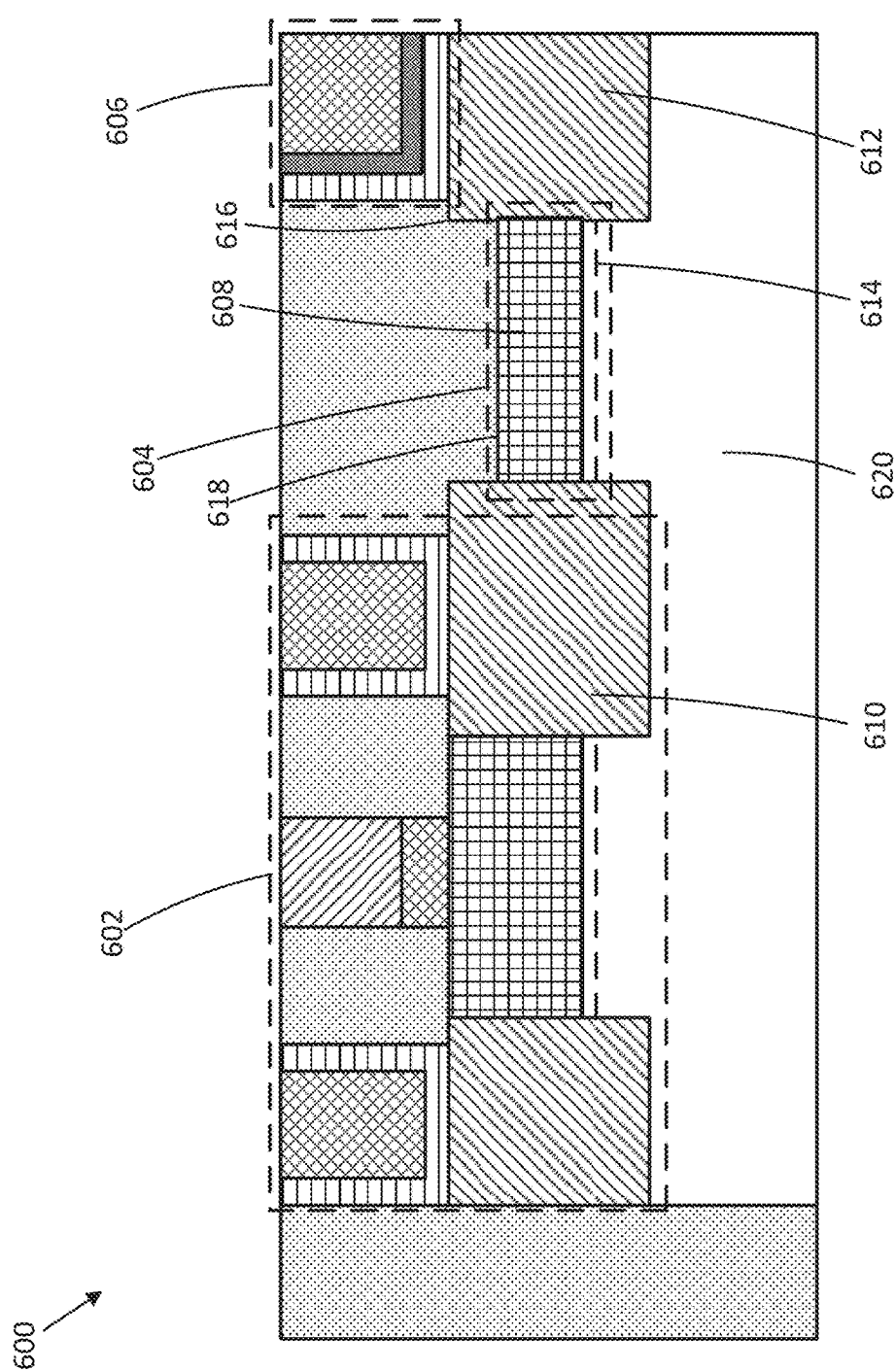
FIG. 6 illustrates a cross-sectional side view of another IC structure in accordance with any of the embodiments of the present disclosure.

FIG. 6 illustrates a cross-sectional side view of another IC structure 600 in accordance with any of the embodiments of the present disclosure. The IC structure 600 may include one or more of the features of the IC structure 500 (FIG. 5). In particular, the transistor 602 includes the features of the transistor 502 (FIG. 5). Further, the capacitor 606 includes the features of the capacitor 506 (FIG. 5). The IC structure 600 includes a transistor 602 in series with an integrated resistor 604 and an integrated capacitor 606. The IC structure 600 may comprise a front-end structure produced by a front-end fabrication process.

The IC structure 600 further includes the resistor 604 that extends between the transistor 602 and the capacitor 606. The resistor 604 comprises a polarization material 608. The polarization material 608 may include one or more of the features of the second polarization material 520 (FIG. 5). The polarization material 608 may include Al, In, Ga, N, or some combination thereof. In some embodiments, the polarization material 608 includes material of the chemical makeup $Al_xIn_yGa_{1-x-y}N$, where x and y are variables.

The polarization material 608 extends between a first doped region 610 corresponding to the transistor 602 and a second doped region 612 corresponding to the capacitor 606. The first doped region 610 and the second doped region 612 may present a very low amount of resistance, and accordingly may be referred to as conductive regions. In instances where the first doped region 610 and/or the second doped region 612 are under a source contact element (such as the source contact element 108 (FIG. 1)) or a drain contact element (such as the drain contact element 112 (FIG. 1)) of a transistor, the first doped region 610 and/or the second doped region 612 may be referred to as a source region or a drain region, respectively. The polarization material 608 couples the first doped region 610 and the second doped region 612 and acts as the resistor 604 between the transistor 602 and the capacitor 606. The polarization material 608 has two-dimensional electron gas 614 (illustrated as a dotted line). As a potential is applied between the first doped region 610 and the second doped region 612, the two-dimensional electron gas 614 facilitates current flow between the first doped region 610 and the second doped region 612, where the two-dimensional electron gas 614 presents resistance to the current flowing via the two-dimensional electron gas 614.

The resistance presented by the two-dimensional electron gas 614 may be based on a chemical makeup of the polarization material 608, a length of the polarization material 608, a thickness of the polarization material 608, or some combination thereof. In the illustrated embodiment, the thickness of the polarization material 608 has been reduced to produce a higher amount of resistance being applied by the two-dimensional electron gas 614. In particular, the polarization material 608 has been thinned to produce the higher amount of resistance than if the polarization material 608 was not thinned. In particular, a thickness of the polarization material 608 can, at least partially, define an amount of tensile stress between the polarization material 608 and the III-N material of a base structure 620 of the IC structure 600, where the polarization material 608 is located over the base structure 620. As the thickness of the polarization material 608 changes, an amount of the tensile stress induced by the polarization material 608 on the III-N material of the base structure 620 can change, which can change an amount of the two-dimensional electron gas 614 in an upper portion of the III-N material, right under the interface with the polarization material 608, which in turn can change the resistance affected by the two-dimensional electron gas 614. An upper edge of the polarization material 608 may have been level with an upper edge 616 of the second doped region 612 prior to the thinning procedure being applied. The thinning procedure thinned the polarization material 608 such that an upper edge 618 is no longer level with the upper edge 616 of the second doped region 612. Thus, in some embodiments, an IC structure may include a polarization material having different thicknesses at different portions of the IC structure. Although not specifically shown in the present figures, in some embodiments, a gate stack of a III-N transistor may be provided in what is commonly referred to as a "gate recess," which is a recess in the polarization material under the gate of the III-N transistor. Outside of that gate region, a thickness of the polarization material is usually uniform. However, as shown, e.g., in FIG. 6, in some embodiments of the present disclosure this may not be the case in that at least a thickness of the polarization material 608 may be different from (e.g., smaller than) a thickness of the polarization material between the conductive region 610 and the gate stack of the III-N transistor shown in FIG. 6 to the left of the conductive region 610. In some embodiments, the difference in thicknesses may be, e.g., between 5 and 95%, including all values and ranges therein, e.g., the difference may be at least 5% or at least 10%, or the difference may be at least 20%.

Figure 7:
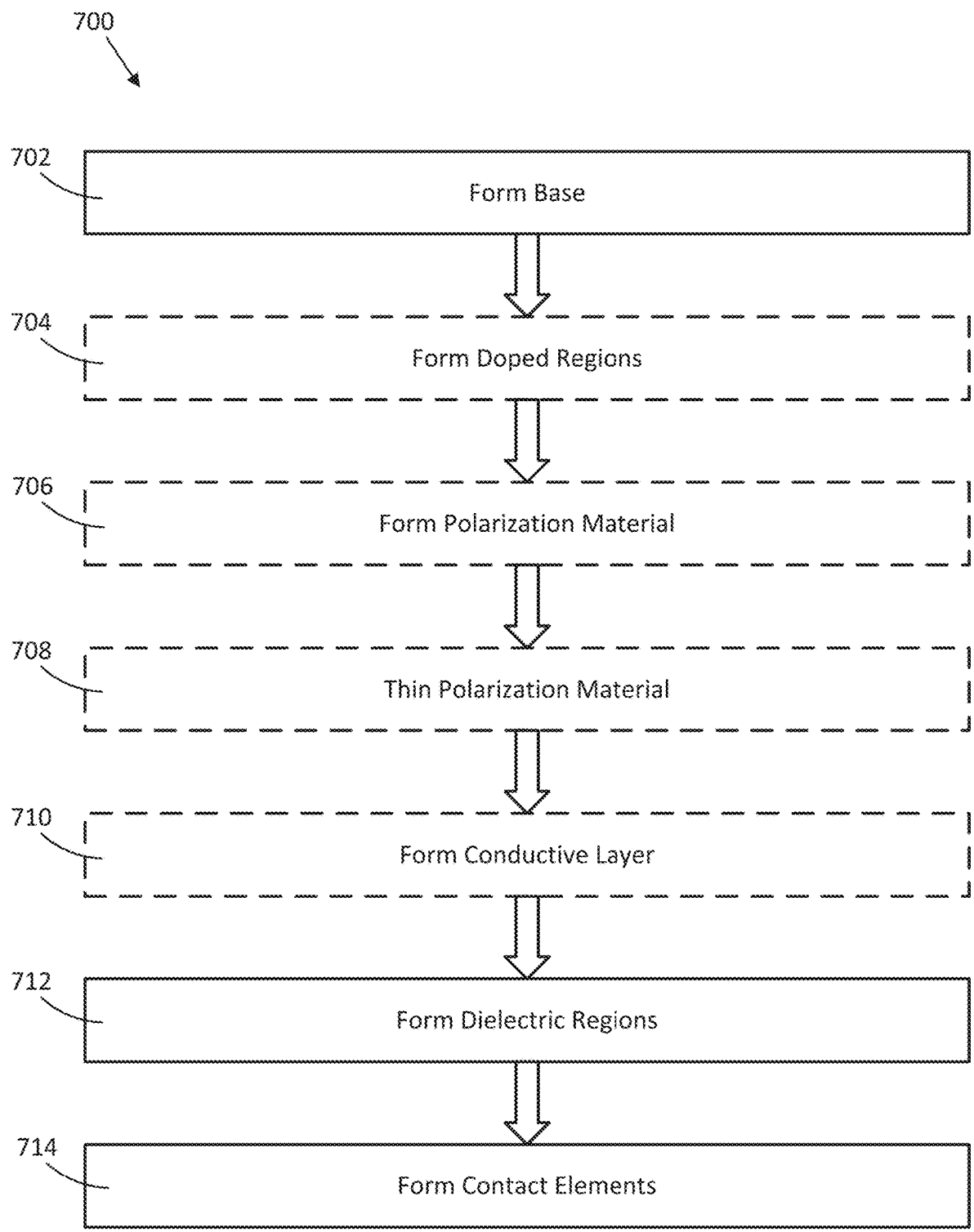
FIG. 7 illustrates a procedure for producing an IC structure in accordance with any of the embodiments of the present disclosure.

FIG. 7 illustrates a procedure 700 for producing an IC structure in accordance with any of the embodiments of the present disclosure. In particular, the procedure 700 illustrates a plurality of stages for producing an IC structure, where certain stages within the procedure 700 may be omitted based on the features of the IC structure being produced. Further, while the procedure 700 illustrates the stages in a certain order for clarity, it is to be understood that the order of the stages may be different in other embodiments and/or two or more of the stages may be performed currently.

In stage 702, a base is formed. The base may be a base structure (such as the base structure 102 (FIG. 1), the base structure 204 (FIG. 2), the base structure 302 (FIG. 3), and/or the base structure 508 (FIG. 5)) or a dielectric region (such as the dielectric region 402 (FIG. 4)) based on the features of the IC structure being produced. For example, the base formed may be a dielectric region when the IC structure to be produced omits transistors (i.e., the IC structure being produced may be limited to including integrated resistors and/or integrated capacitors), such as the IC structure 400 (FIG. 4). The base formed may be a base structure in when the IC structure to be produced includes transistors, integrated resistors, integrated capacitors, or some combination thereof, such as the IC structure 100 (FIG. 1), the IC structure 200 (FIG. 2), the IC structure 300 (FIG. 3), the IC structure 500 (FIG. 5), and/or the IC structure 600 (FIG. 6).

In stage 704, doped regions may be formed. The doped regions may be formed by doping portions of the base structure produced in stage 702. Doping the portions of the base structure may produce one or more doped regions, such as the first doped region 116 (FIG. 1), the second doped region 118 (FIG. 1), the doped region 206 (FIG. 2), the doped region 304 (FIG. 3), the first doped region 510 (FIG. 5), the second doped region 512 (FIG. 5), the third doped region 514 (FIG. 5), the first doped region 610 (FIG. 6), and/or the second doped region 612 (FIG. 6). In some embodiments, stage 704 may be omitted when the IC structure to be produced does not include any doped regions, such as IC structure 400 (FIG. 4).

In stage 706, polarization materials may be formed. In particular, forming the polarization materials may include forming material having larger spontaneous and/or piezoelectric polarization than that of the bulk of the III-N material of the base. The polarization materials and the III-N material of the base may form a heterojunction (i.e., an interface that occurs between two layers or regions of semiconductors having unequal band gaps), which can lead to the formation of a two-dimensional electron gas. Forming the polarization materials of the base structure may produce one or more polarization materials, such as the polarization material 122 (FIG. 1), the first polarization material 518 (FIG. 5), the second polarization material 520 (FIG. 5), and/or the polarization material 608 (FIG. 6). Stage 706 may be performed for IC structures to be produced that include transistors and/or integrated resistors, such as the IC structure 100, the IC structure 500, and/or the IC structure 600. Stage 706 may be omitted for IC structures that omit transistors and integrated resistors and/or do not include polarization materials, such as the IC structure 200, the IC structure 300, and/or the IC structure 400.

In stage 708, one or more of the polarization materials formed in stage 706 may be thinned. Thinning of the polarization materials may include grinding of a portion of the polarization materials, chemical mechanical polishing of the polarization materials, wet etching of the polarization materials, atmospheric downstream plasma (ADP) dry chemical etching (DCE) of the polarization materials, or some combination thereof. Thinning of the polarization materials may be applied to polarization materials where a higher resistance is desired, such as with the polarization material 608 (FIG. 6). Stage 708 may be omitted in some embodiments, such as when the resistance of the polarization material produced in stage 706 is adequate for the IC structure.

In stage 710, one or more conductive layers may be formed. The conductive layers may be formed on one or more sides of the base (which may include a base structure, a dielectric region, doped regions of the base structure, and/or polarization materials of the base structure). Examples of conductive layers formed in stage 710 includes the conductive layer 208 (FIG. 2), the conductive layer 306 (FIG. 3), and/or the conductive layer 404 (FIG. 4). In some embodiment, stage 710 may be omitted when the IC structure does not include a conductive layer, such as the IC structure 100, the IC structure 500, and/or the IC structure 600.

In stage 712, one or more dielectric regions are formed. In particular, the dielectric regions may be formed on one or more sides of the base (which may include a base structure, a dielectric region, doped regions of the base structure, and/or polarization materials of the base structure) and/or the conductive layers. The dielectric regions may cover the entire surface of the sides of the base and/or conductive layers on which the dielectric regions are formed. Forming the dielectric regions may include curing portions of a dielectric material applied to the base and removing portions of the dielectric material to produce the dielectric regions. Examples of the dielectric regions produced include, the dielectric regions 142 (FIG. 1), the dielectric regions 222 (FIG. 2), and/or the dielectric regions 550 (FIG. 5). In some embodiments, stage 712 may produce initial dielectric regions that further processing may be performed to produce dielectric elements, such as the first dielectric element 310 (FIG. 3), the second dielectric element 312 (FIG. 3), the first dielectric element 408 (FIG. 4), and/or the second dielectric element 410 (FIG. 4). In other embodiments, stage 712 may be omitted.

In stage 714, one or more contact elements are formed. The contact elements may be formed between one or more of the dielectric elements formed in stage 712 in some embodiments. In some embodiments, forming the contact elements may include removing portions of the dielectric regions formed in stage 712 to produce recesses for the contact elements, such as through removal of portions of the dielectric regions that are uncured, removal of the portions of the dielectric regions by physical means (i.e., drilling, and/or ablation), or some combination thereof. The contact elements may be formed on the base (which may include a base structure, a dielectric region, doped regions of the base structure, and/or polarization materials of the base structure) or one or more of the conductive layers. The contact elements formed may include source contact elements, gate stacks, drain contact elements, contact elements, contacts, or some combination thereof. In particular, examples of the source contact elements include the source contact element 108 (FIG. 1) and/or the source contact element 522 (FIG. 5). Examples of the gate stacks include the gate stack 110 (FIG. 1) and/or the gate stack 524 (FIG. 5). Examples of the drain contact elements include the drain contact element 112 (FIG. 1) and/or the drain contact element 526 (FIG. 5). Examples of the contact elements include the contact element 134 (FIG. 1), the contact element 210 (FIG. 2), the contact element 216 (FIG. 2), and/or the contact element 540 (FIG. 5). Examples of the contacts include the plurality of contacts 308 (FIG. 3) and/or the plurality of contacts 406 (FIG. 4).

Forming the gate stacks includes forming a dielectric region and conductive element at a location for the gate stack. The location for the gate stack may be located between dielectric regions formed in stage 712 and on a polarization material of a transistor (such as the polarization material 122 and/or the first polarization material 518). A dielectric material may be applied on the polarization material and cured to form a dielectric region on the polarization material, such as the dielectric region 114 (FIG. 1) and/or the dielectric region 528 (FIG. 5). A conductive material may be applied on the dielectric material to form a conductive element on the dielectric element, such as the conductive element 124 (FIG. 1) and/or the conductive element 530 (FIG. 5).

Forming the source contact elements and the drain contact elements includes forming a first conductive element and a second conductive element at a location for the source contact elements and the drain contact elements, respectively. The locations for the source contact elements and the drain contact elements may be located between dielectric regions formed in stage 712 and on doped regions of a transistor (such as the first doped region 116, the second doped region 118, the first doped region 510, the second doped region 512, and/or the first doped region 610). A first conductive material may be applied to the walls of a recess for the source contact element or the drain contact element to form a first conductive element, such as the first conductive element 126 (FIG. 1), a first conductive element 130 (FIG. 1), the first conductive element 532 (FIG. 5), and/or the first conductive element 536 (FIG. 5). The first conductive material may be applied via atomic layer deposition (ALD). In some embodiments, the conductive material applied may include Ti and/or N, such as titanium nitride. A second conductive material may be applied on the first conductive element to form a second conductive element on the first conductive element, such as the second conductive element 128 (FIG. 1), the second conductive element 132 (FIG. 1), the second conductive element 534 (FIG. 5), and/or the second conductive element 538 (FIG. 5). In some embodiments, the second conductive material applied may be a W contact material.

A procedure for forming the contact elements may depend on whether the contact element is being formed on a conductive layer, being formed as an integrated capacitor, or some combination thereof. Where the contact element is being formed on a conductive layer and is not to be part of an integrated capacitor, forming the contact element includes forming one or two conductive elements. In embodiments where two conductive elements are formed, a first conductive element may be formed on one or more sidewalls of the recess in which the contact element is to be formed and may extend from the conductive layer to an edge of the recess, such as the first conductive element 212 (FIG. 2). In some embodiments, the first conductive element may comprise Ti and/or N, such as titanium nitride. A second conductive element may be applied on the conductive layer and may fill the remainder of the recess, such as the second conductive element 214 (FIG. 2). In some embodiments, the second conductive element may comprise W contact material. In embodiments, where a single conductive element is formed, the entire recess may be filled with a single conductive element. The single conductive element may comprise W contact material.

Where the contact element is being formed on a conductive layer and is to be part of an integrated capacitor, forming the contact element includes forming a dielectric element and a conductive element. A dielectric material may be applied on the conductive layer and to one or more of the walls of the recess in which the contact element is to be formed to produce the dielectric element, such as the dielectric element 218 (FIG. 2). The dielectric material may be applied via ALD. Further, the dielectric material may be applied at a uniform thickness. After being applied, the dielectric material may be cured to form the dielectric element. The conductive element is formed on the dielectric material and fills the remainder of the recess.

Where the contact element is being formed on the base and is to be part of an integrated capacitor, forming the contact element includes forming a first conductive element, a second conductive element, and a dielectric element. A first conductive material may be applied on the base and to one or more of the walls of the recess in which the contact element is to be formed to produce the first conductive element, such as the first conductive element 136 (FIG. 1) and/or the first conductive element 542 (FIG. 5). The first conductive material may comprise Ti and/or N, such as titanium nitride. The first conductive material may be applied via ALD. A dielectric material may be applied on the first conductive element and may be cured to form a dielectric element, such as the dielectric element 138 (FIG. 1) and/or the dielectric element 544 (FIG. 5). The dielectric material may be applied via ALD. The dielectric element may be formed on the bottom and one or more walls of the recess remaining after the first conductive element had been formed. The dielectric element may have a uniform thickness. A second conductive material may be applied on the dielectric element and may fill the recess remaining after the first conductive element and the dielectric element have been formed to form the second conductive element, such as the second conductive element 140 (FIG. 1) and/or the second conductive element 546 (FIG. 5). In some embodiments, the second conductive material may comprise W contact material.

Forming the contacts includes forming a conductive element within a recess between dielectric regions. A conductive material may be applied within the recess to form the contact, such as the first contact 308a (FIG. 3), the third contact 308c (FIG. 3), the first contact 406a (FIG. 4), and/or the third contact 406c (FIG. 4). In some instances, the contacts may abut a conductive layer on which the contact is being formed. In other instances, a contact may be formed within a recess formed within dielectric element, where a portion of the dielectric element is located between the contact and a conductive layer of the IC structure. A conductive material may be applied within the recess of the dielectric element and fill the recess to form a contact, such as the second contact 308b (FIG. 3), the fourth contact 308d (FIG. 3), the second contact 406b (FIG. 4), and/or the fourth contact 406d (FIG. 4). In some embodiments, forming the contacts may further include forming the recess in the dielectric element, such as by physical means (i.e., drilling, and/or ablation). In other embodiments, forming the contacts may further include forming the dielectric element in which the contact is to be formed. In these embodiments, a dielectric element and a conductive element may be formed in a recess on a conductive layer. A dielectric material may be applied on the conductive layer on the first conductive element and one or more walls of the recess, and may be cured to form a dielectric element, such as the first dielectric element 310 (FIG. 3), the second dielectric element 312 (FIG. 3), the first dielectric element 408 (FIG. 4), and/or the second dielectric element 410 (FIG. 4). The dielectric material may be applied via ALD. The dielectric element may have a uniform thickness. A conductive material may be applied on the dielectric element and may fill the remaining recess after the dielectric element had been formed to form the conductive element, which may be the second contact 308b, the fourth contact 308d, the second contact 406b, and/or the fourth contact 406d.

Example Structures and Devices with Integrated Resistors and/or Integrated Capacitors IC structures that include one or more integrated resistors and/or one or more integrated capacitors as disclosed herein may be included in any suitable electronic device. FIG. 8A, FIG. 8B, and FIGS. 9-12 illustrate various examples of devices and components that may include one or more integrated resistors and/or one or more integrated capacitors as disclosed herein.

Figure 8B:
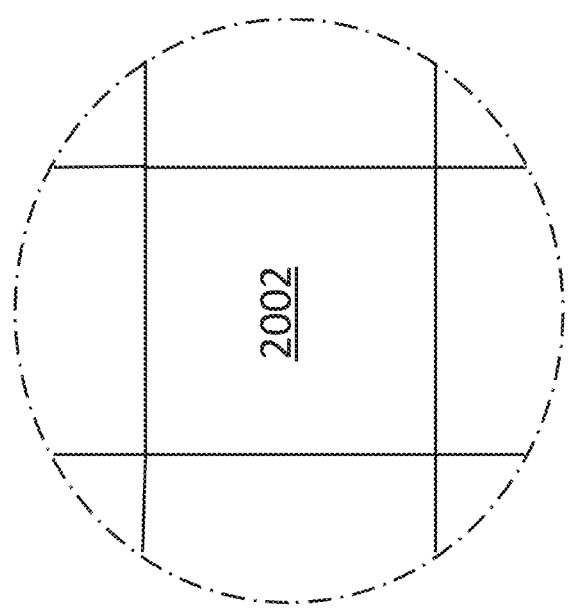
FIG. 8B is top view of a die that may include one or more integrated resistors and/or one or more integrated capacitors in accordance with any of the embodiments disclosed herein.
Figure 8A:
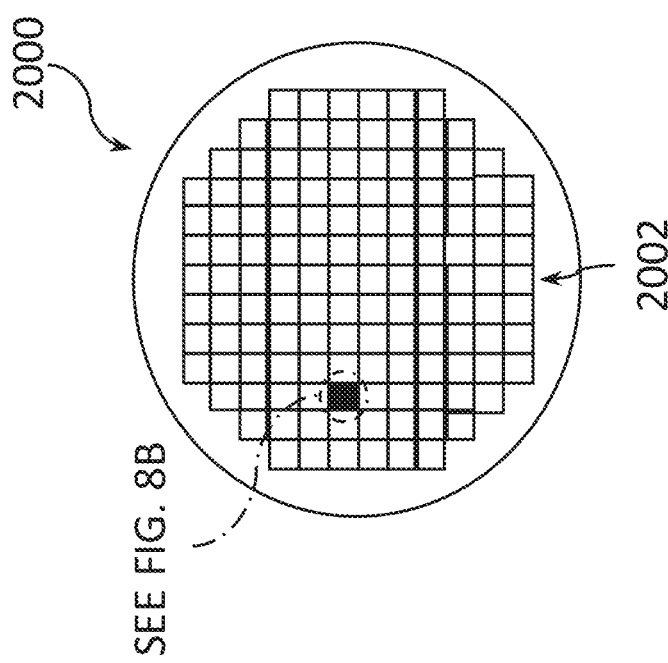
FIG. 8A is a top view of a wafer that may include one or more integrated resistors and/or one or more integrated capacitors in accordance with any of the embodiments disclosed herein.

FIGS. 8A-8B are top views of a wafer 2000 and dies 2002 that may include one or more integrated resistors and/or one or more integrated capacitors in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 9. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more transistors, one or more integrated resistors, and/or one or more integrated capacitors as described herein). After the fabrication of the semiconductor product is complete (e.g., after manufacture of any IC structures in accordance with embodiments described herein, such as the IC structure 100 (FIG. 1), the IC structure 200 (FIG. 2), the IC structure 300 (FIG. 3), the IC structure 400 (FIG. 4), the IC structure 500 (FIG. 5), and/or the IC structure 600 (FIG. 6)), the wafer 2000 may undergo a singulation process in which each of the dies 2002 is separated from one another to provide discrete "chips" of the semiconductor product. In particular, devices that include one or more integrated resistors and/or integrated capacitors as disclosed herein may take the form of the wafer 2000 (e.g., not singulated) or the form of the die 2002 (e.g., singulated). The die 2002 may include one or more transistors (e.g., one or more of the transistor 104 (FIG. 1), the transistor 502 (FIG. 5), and/or the transistor 602 (FIG. 6) as described herein), one or more integrated resistors (e.g., one or more of the resistor 504 (FIG. 5) and/or the resistor 604 (FIG. 6) as described herein), and/or one or more integrated capacitors (e.g., one or more of the capacitor 106 (FIG. 1), the capacitor (FIG. 2), the capacitors of the IC structure 300, the capacitors of the IC structure 400, the capacitor 506 (FIG. 5), and/or the capacitor 606 (FIG. 6) as described herein) as well as, optionally, supporting circuitry to route electrical signals among the transistors, integrated resistors, and/or integrated capacitors, as well as any other IC components. In some embodiments, the wafer 2000 or the die 2002 may implement an RF FE device, a memory device (e.g., a static random-access memory (SRAM) device), a logic device (e.g., an AND, OR, NAND, or NOR gate), or any other suitable circuit element. Multiple ones of these devices may be combined on a single die 2002.

Figure 9:
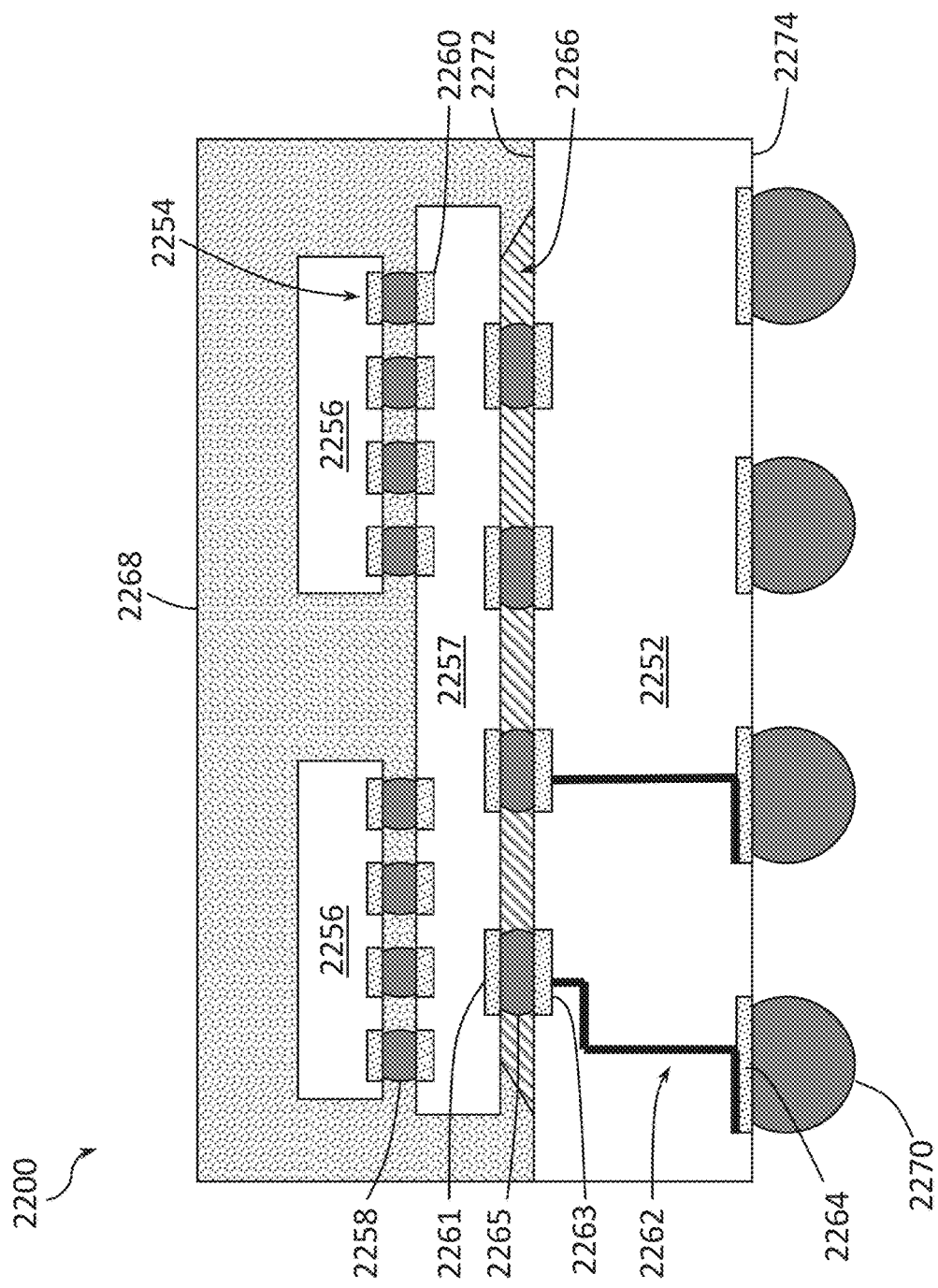
FIG. 9 is a side, cross-sectional view of an example IC package that may include one or more IC structures having one or more integrated resistors and/or one or more integrated capacitors in accordance with any of the embodiments disclosed herein.

FIG. 9 is a side, cross-sectional view of an example IC package 2200 that may include one or more IC structures having one or more integrated resistors and/or one or more integrated capacitors in accordance with any of the embodiments disclosed herein. In some embodiments, the IC package 2200 may be a system-in-package (SiP).

As shown in FIG. 9, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 9 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 9 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268.

Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 9 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 10.

The dies 2256 may take the form of any of the embodiments of the die 2002 discussed herein and may include any of the embodiments of an IC structure having one or more integrated resistors and/or one or more integrated capacitors, e.g., any of the IC structure 100, the IC structure 200, the IC structure 300, the IC structure 400, the IC structure 500, and/or the IC structure 600, described herein. In embodiments in which the IC package 2200 includes multiple dies 2256, the IC package 2200 may be referred to as a MCP. Importantly, even in such embodiments of an MCP implementation of the IC package 2200, one or more of the integrated resistors and/or one or more of the integrated capacitors may be integrated in a single chip, in accordance with any of the embodiments described herein. The dies 2256 may include circuitry to perform any desired functionality. For example, one or more of the dies 2256 may be RF FE dies, including one or more integrated resistors and/or one or more integrated capacitors in a single die as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more integrated resistors and/or integrated capacitors, e.g., as discussed above; in some embodiments, at least some of the dies 2256 may not include any integrated capacitors and integrated resistors.

The IC package 2200 illustrated in FIG. 9 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 9, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 10:
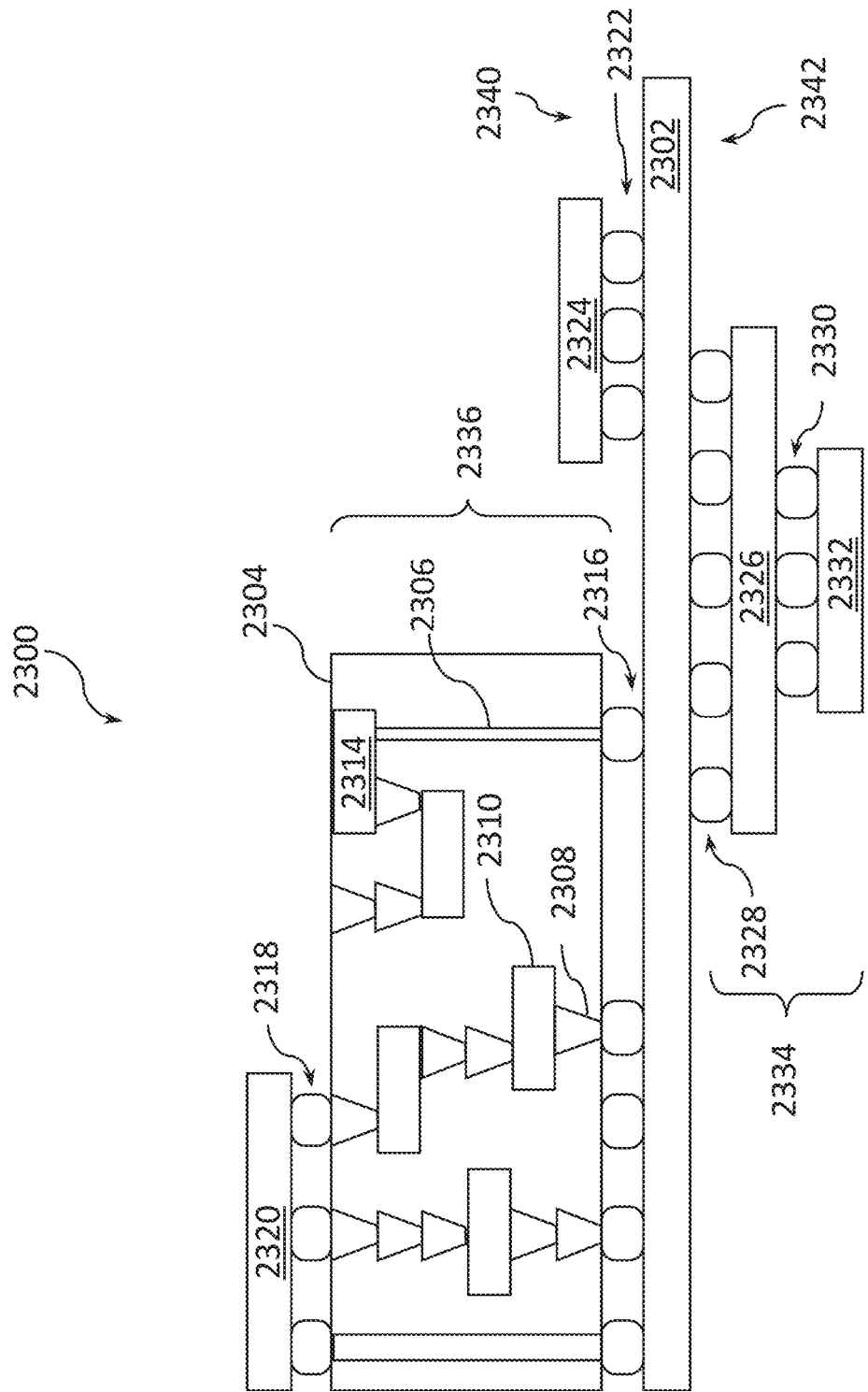
FIG. 10 is a cross-sectional side view of an IC device assembly that may include components having one or more IC structures implementing one or more integrated resistors and/or one or more integrated capacitors in accordance with any of the embodiments disclosed herein.

FIG. 10 is a cross-sectional side view of an IC device assembly 2300 that may include components having one or more IC structures implementing one or more integrated resistors and/or one or more integrated capacitors in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC structures implementing one or more integrated resistors and/or one or more integrated capacitors in accordance with any of the embodiments disclosed herein; e.g., any of the IC packages discussed below with reference to the IC device assembly 2300 may take the form of any of the embodiments of the IC package 2200 discussed above with reference to FIG. 9 (e.g., may include one or more integrated resistors and/or integrated capacitors in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 10 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 10), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 8B), an IC device (e.g., the IC structures of FIGS. 1-6), or any other suitable component. In particular, the IC package 2320 may include one or more integrated resistors and/or one or more integrated capacitors as described herein. Although a single IC package 2320 is shown in FIG. 10, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 10, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC structures implementing one or more integrated resistors and/or integrated capacitors as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 10 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 11:
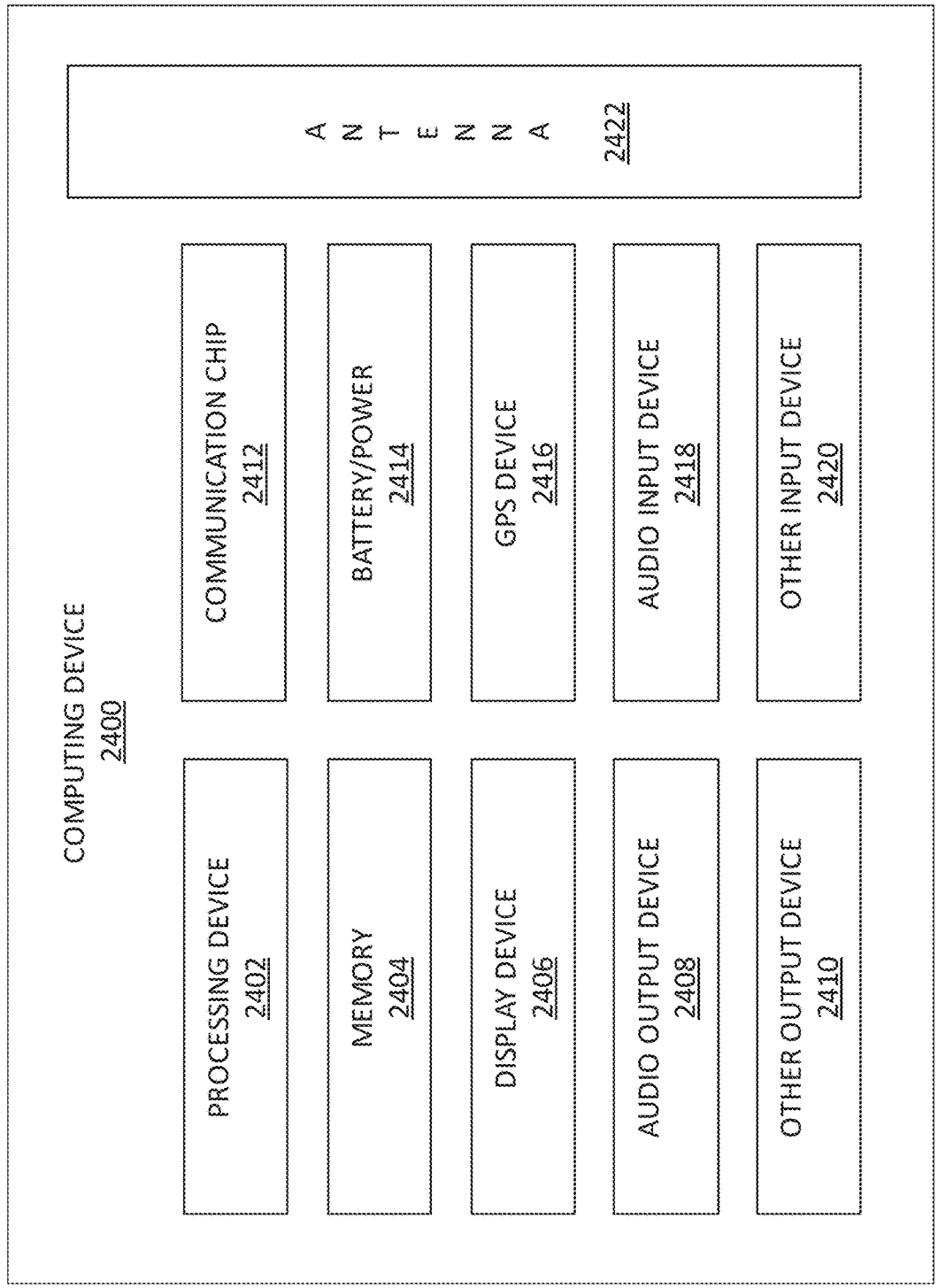
FIG. 11 is a block diagram of an example computing device that may include one or more components with one or more IC structures having one or more integrated resistors and/or one or more integrated capacitors in accordance with any of the embodiments disclosed herein.

FIG. 11 is a block diagram of an example computing device 2400 that may include one or more components with one or more IC structures having one or more integrated resistors and/or one or more integrated capacitors in accordance with any of the embodiments disclosed herein. For example, any suitable ones of the components of the computing device 2400 may include a die (e.g., the die 2002 (FIG. 8B)) including one or more integrated resistors and/or one or more integrated capacitors in accordance with any of the embodiments disclosed herein. Any of the components of the computing device 2400 may include an IC device (e.g., any embodiment of the IC structures of FIGS. 1-6) and/or an IC package 2200 (FIG. 9). Any of the components of the computing device 2400 may include an IC device assembly 2300 (FIG. 10).

A number of components are illustrated in FIG. 11 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 11, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-M RAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC structures including one or more III-N transistors as described herein may be particularly advantageous for use within the one or more communication chips 2412, described above. For example, such IC structures may be used to implement one or more of power amplifiers, low-noise amplifiers, filters (including arrays of filters and filter banks), switches, upconverters, downconverters, and duplexers.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 12:
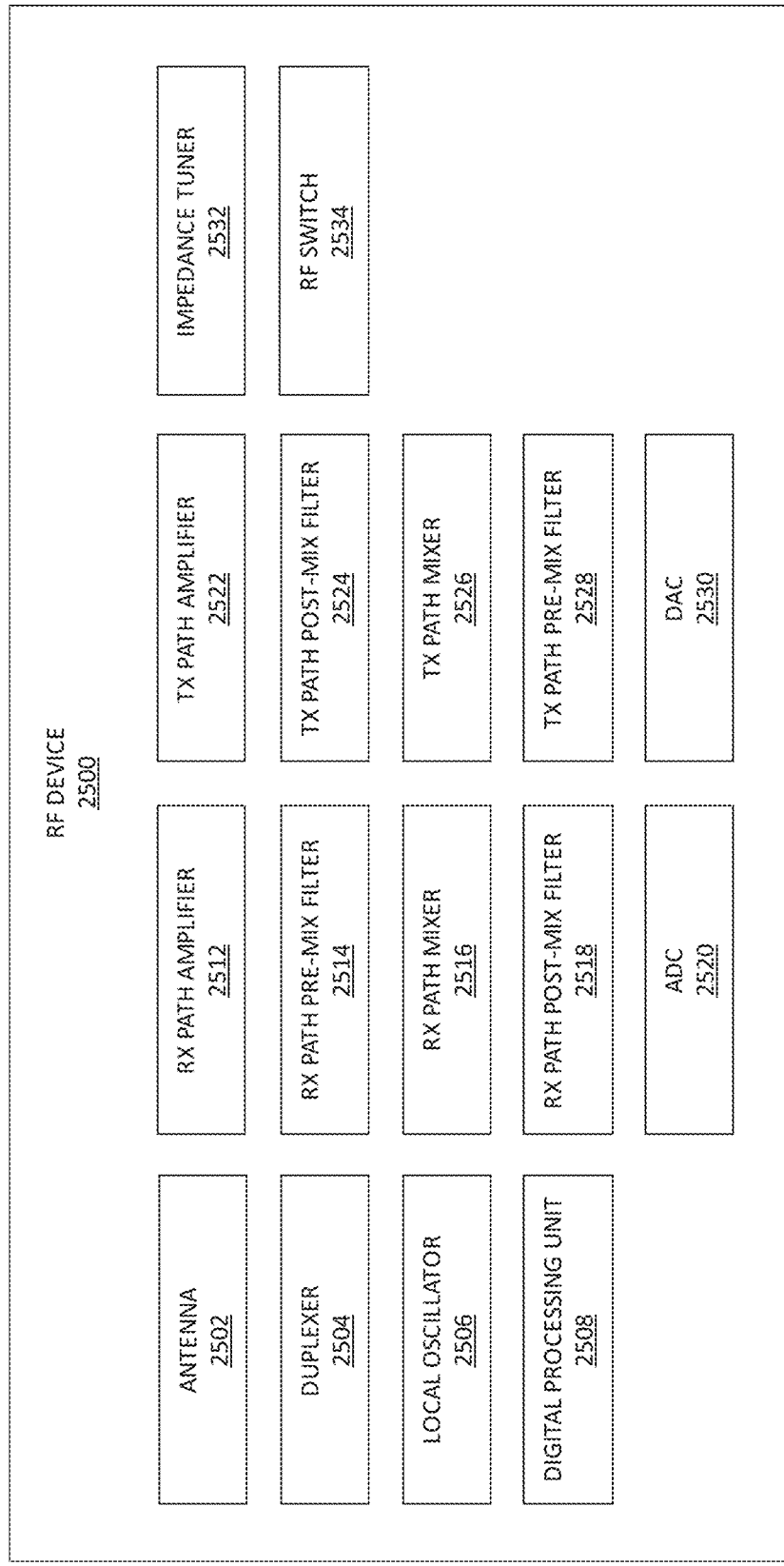
FIG. 12 is a block diagram of an example RF device that may include one or more components with one or more integrated resistors and/or one or more integrated capacitors in accordance with any of the embodiments disclosed herein.

FIG. 12 is a block diagram of an example RF device 2500 that may include one or more components with one or more integrated resistors and/or one or more integrated capacitors in accordance with any of the embodiments disclosed herein. For example, any suitable ones of the components of the RF device 2500 may include a die (e.g., the die 2002 as described with reference to FIG. 8 or a die implementing the IC structure 100 as described with reference to FIG. 1) including one or more integrated resistors and/or integrated capacitors in accordance with any of the embodiments disclosed herein. Any of the components of the RF device 2500 may include an IC device (e.g., the IC structures of FIGS. 1-6) and/or an IC package 2200 as described with reference to FIG. 9. Any of the components of the RF device 2500 may include an IC device assembly 2300 as described with reference to FIG. 10. In some embodiments, the RF device 2500 may be included within any components of the computing device 2400 as described with reference to FIG. 11, or may be coupled to any of the components of the computing device 2400, e.g., be coupled to the memory 2404 and/or to the processing device 2402 of the computing device 2400. In still other embodiments, the RF device 2500 may further include any of the components described with reference to FIG. 11, such as, but not limited to, the battery/power circuit 2414, the memory 2404, and various input and output devices as shown in FIG. 11.

In general, the RF device 2500 may be any device or system that may transmit and/or receive signals in the form of electromagnetic waves in the RF range of approximately 3 kiloHertz (kHz) to 300 gigaHertz (GHz). In some embodiments, the RF device 2500 may be used for wireless communications, e.g., in a BS or a UE device of any suitable cellular wireless communications technology, such as GSM, WCDMA, or LTE. In a further example, the RF device 2500 may be used as, or in, e.g., a BS or a UE device of a mm-wave wireless technology such as fifth generation (5G) wireless (i.e., high frequency/short wavelength spectrum, e.g., with frequencies in the range between about 20 and 60 GHz, corresponding to wavelengths in the range between about 5 and 15 millimeters). In yet another example, the RF device 2500 may be used for wireless communications using WiFi technology (e.g., a frequency band of 2.4 GHz, corresponding to a wavelength of about 12 cm, or a frequency band of 5.8 GHz, spectrum, corresponding to a wavelength of about 5 cm), e.g., in a WiFi-enabled device such as a desktop, a laptop, a video game console, a smart phone, a tablet, a smart TV, a digital audio player, a car, a printer, etc. In some implementations, a WiFi-enabled device may, e.g., be a node in a smart system configured to communicate data with other nodes, e.g., a smart sensor. Still in another example, the RF device 2500 may be used for wireless communications using Bluetooth technology (e.g., a frequency band from about 2.4 to about 2.485 GHz). In other embodiments, the RF device 2500 may be used for transmitting and/or receiving RF signals for purposes other than communication, e.g., in an automotive radar system, or in medical applications such as magneto-resonance imaging (MRI).

In various embodiments, the RF device 2500 may be included in FDD or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

A number of components are illustrated in FIG. 12 as included in the RF device 2500, but any one or more of these components may be omitted or duplicated, as suitable for the application. For example, in some embodiments, the RF device 2500 may be an RF transceiver, in which case it may include both the components of what is referred to herein as a transmit (TX) path and the components of what is referred to herein as a receive (RX) path. However, in other embodiments, the RF device 2500 may be an RF receiver, in which case it may include the components of the RX path, but not the components of the TX path; or the RF device 2500 may be an RF transmitter, in which case it may include the components of the TX path, but not the components of the RX path.

In some embodiments, some or all of the components included in the RF device 2500 may be attached to one or more motherboards. In some embodiments, some or all of these components are fabricated on a single die, e.g., on a single SoC die.

Additionally, in various embodiments, the RF device 2500 may not include one or more of the components illustrated in FIG. 12, but the RF device 2500 may include interface circuitry for coupling to the one or more components. For example, the RF device 2500 may not include an antenna 2502, but may include antenna interface circuitry (e.g., a matching circuitry, a connector and driver circuitry) to which an antenna 2502 may be coupled. In another set of examples, the RF device 2500 may not include a digital processing unit 2508 or a local oscillator 2506, but may include device interface circuitry (e.g., connectors and supporting circuitry) to which a digital processing unit 2508 or a local oscillator 2506 may be coupled.

As shown in FIG. 12, the RF device 2500 may include an antenna 2502, a duplexer 2504, a local oscillator 2506, a digital processing unit 2508. As also shown in FIG. 12, the RF device 2500 may include an RX path which may include an RX path amplifier 2512, an RX path pre-mix filter 2514, a RX path mixer 2516, an RX path post-mix filter 2518, and an analog-to-digital converter (ADC) 2520. As further shown in FIG. 12, the RF device 2500 may include a TX path which may include a TX path amplifier 2522, a TX path post-mix filter 2524, a TX path mixer 2526, a TX path pre-mix filter 2528, and a digital-to-analog converter (DAC) 2530. Still further, the RF device 2500 may further include an impedance tuner 2532 and an RF switch 2534. In various embodiments, the RF device 2500 may include multiple instances of any of the components shown in FIG. 12.

The antenna 2502 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2500 is an FDD transceiver, the antenna 2502 may be configured for concurrent reception and transmission of communication signals in separate, i.e., non-overlapping and non-continuous, bands of frequencies, e.g. in bands having a separation of, e.g., 20 MHz from one another. If the RF device 2500 is a TDD transceiver, the antenna 2502 may be configured for sequential reception and transmission of communication signals in bands of frequencies which may be the same, or overlapping for TX and RX paths. In some embodiments, the RF device 2500 may be a multi-band RF device, in which case the antenna 2502 may be configured for concurrent reception of signals having multiple RF components in separate frequency bands and/or configured for concurrent transmission of signals having multiple RF components in separate frequency bands. In such embodiments, the antenna 2502 may be a single wide-band antenna or a plurality of band-specific antennas (i.e., a plurality of antennas each configured to receive and/or transmit signals in a specific band of frequencies). In various embodiments, the antenna 2502 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2500 may include more than one antenna 2502 to implement antenna diversity. In some such embodiments, the RF switch 2534 may be deployed to switch between different antennas.

An output of the antenna 2502 may be coupled to the input of the duplexer 2504. The duplexer 2504 may be any suitable component configured for filtering multiple signals to allow for bidirectional communication over a single path between the duplexer 2504 and the antenna 2502. The duplexer 2504 may be configured for providing RX signals to the RX path of the RF device 2500 and for receiving TX signals from the TX path of the RF device 2500.

The RF device 2500 may include one or more local oscillators 2506, configured to provide local oscillator signals which may be used for downconversion of the RF signals received by the antenna 2502 and/or upconversion of the signals to be transmitted by the antenna 2502.

The RF device 2500 may include the digital processing unit 2508, which may include one or more processing devices. In some embodiments, the digital processing unit 2508 may be implemented as the processing device 2402 shown in FIG. 11, descriptions of which are provided above (when used as the digital processing unit 2508, the processing device 2402 may, but does not have to, implement any of the IC structures as described herein, e.g., IC structures having one or more integrated resistors and/or one or more integrated capacitors in accordance with any of the embodiments disclosed herein). The digital processing unit 2508 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 12, in some embodiments, the RF device 2500 may further include a memory device, e.g., the memory device 2404 as described with reference to FIG. 11, configured to cooperate with the digital processing unit 2508. When used within, or coupled to, the RF device 2500, the memory device 2404 may, but does not have to, implement any of the IC structures as described herein, e.g., IC structures having one or more integrated resistors and/or one or more integrated capacitors in accordance with any of the embodiments disclosed herein.

Turning to the details of the RX path that may be included in the RF device 2500, the RX path amplifier 2512 may include an LNA. An input of the RX path amplifier 2512 may be coupled to an antenna port (not shown) of the antenna 2502, e.g., via the duplexer 2504. The RX path amplifier 2512 may amplify the RF signals received by the antenna 2502.

An output of the RX path amplifier 2512 may be coupled to an input of the RX path pre-mix filter 2514, which may be a harmonic or band-pass filter, configured to filter received RF signals that have been amplified by the RX path amplifier 2512.

An output of the RX path pre-mix filter 2514 may be coupled to an input of the RX path mixer 2516, also referred to as a downconverter. The RX path mixer 2516 may include two inputs and one output. A first input may be configured to receive the RX signals, which may be current signals, indicative of the signals received by the antenna 2502 (e.g., the first input may receive the output of the RX path pre-mix filter 2514). A second input may be configured to receive local oscillator signals from one of the local oscillators 2506. The RX path mixer 2516 may then mix the signals received at its two inputs to generate a downconverted RX signal, provided at an output of the RX path mixer 2516. As used herein, downconversion refers to a process of mixing a received RF signal with a local oscillator signal to generate a signal of a lower frequency. In particular, the downconverter 2516 may be configured to generate the sum and/or the difference frequency at the output port when two input frequencies are provided at the two input ports. In some embodiments, the RF device 2500 may implement a direct-conversion receiver (DCR), also known as homodyne, synchrodyne, or zero-IF receiver, in which case the RX path mixer 2516 may be configured to demodulate the incoming radio signals using local oscillator signals whose frequency is identical to, or very close to the carrier frequency of the radio signal. In other embodiments, the RF device 2500 may make use of downconversion to an intermediate frequency (IF). IFs may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2516 may include several such stages of IF conversion.

Although a single RX path mixer 2516 is shown in the RX path of FIG. 12, in some embodiments, the RX path mixer 2516 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2502 and an in-phase component of the local oscillator signal provided by the local oscillator 2506. The second RX path mixer may be configured for performing downconversion to generate a quadrature (Q) downconverted RX signal by mixing the RX signal received by the antenna 2502 and a quadrature component of the local oscillator signal provided by the local oscillator 2506 (the quadrature component is a component that is offset in phase from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2516 may, optionally, be coupled to the RX path post-mix filter 2518, which may be low-pass filters. In case the RX path mixer 2516 is a quadrature mixer that implements the first and second mixers as described above, the in-phase and quadrature components provided at the outputs of the first and second mixers respectively may be coupled to respective individual first and second RX path post-mix filters included in the filter 2518.

The ADC 2520 may be configured to convert the mixed RX signals from the RX path mixer 2516 from analog-to-digital domain. The ADC 2520 may be a quadrature ADC that, similar to the RX path quadrature mixer 2516, may include two ADCs, configured to digitize the downconverted RX path signals separated in in-phase and quadrature components. The output of the ADC 2520 may be provided to the digital processing unit 2508, configured to perform various functions related to digital processing of the RX signals so that information encoded in the RX signals can be extracted.

Turning to the details of the TX path that may be included in the RF device 2500, the digital signal to later be transmitted (TX signal) by the antenna 2502 may be provided, from the digital processing unit 2508, to the DAC 2530. Similar to the ADC 2520, the DAC 2530 may include two DACs, configured to convert, respectively, digital I- and Q-path TX signal components to analog form.

Optionally, the output of the DAC 2530 may be coupled to the TX path pre-mix filter 2528, which may be a band-pass filter (or a pair of band-pass filters, in case of quadrature processing) configured to filter out, from the analog TX signals output by the DAC 2530, the signal components outside of the desired band. The digital TX signals may then be provided to the TX path mixer 2526, which may also be referred to as an upconverter. Similar to the RX path mixer 2516, the TX path mixer 2526 may include a pair of TX path mixers, for in-phase and quadrature component mixing. Similar to the first and second RX path mixers that may be included in the RX path, each of the TX path mixers of the TX path mixer 2526 may include two inputs and one output. A first input may receive the TX signal components, converted to the analog form by the respective DAC 2530, which are to be upconverted to generate RF signals to be transmitted. The first TX path mixer may generate an in-phase (I) upconverted signal by mixing the TX signal component converted to analog form by the DAC 2530 with the in-phase component of the TX path local oscillator signal provided from the local oscillator 2506 (in various embodiments, the local oscillator 2506 may include a plurality of different local oscillators, or be configured to provide different local oscillator frequencies for the mixer 2516 in the RX path and the mixer 2526 in the TX path). The second TX path mixer may generate a quadrature phase (Q) upconverted signal by mixing the TX signal component converted to analog form by the DAC 2530 with the quadrature component of the TX path local oscillator signal. The output of the second TX path mixer may be added to the output of the first TX path mixer to create a real RF signal. A second input of each of the TX path mixers may be coupled the local oscillator 2506.

Optionally, the RF device 2500 may include the TX path post-mix filter 2524, configured to filter the output of the TX path mixer 2526.

The TX path amplifier 2522 may be a PA, configured to amplify the upconverted RF signal before providing it to the antenna 2502 for transmission.

In various embodiments, any of the RX path pre-mix filter 2514, the RX path post-mix filter 2518, the TX post-mix filter 2524, and the TX pre-mix filter 2528 may be implemented as RF filters. In some embodiments, each of such RF filters may include one or more, typically a plurality of, resonators (e.g., film bulk acoustic resonators (FBARs), Lamb wave resonators, and/or contour-wave resonators), arranged, e.g., in a ladder configuration. An individual resonator of an RF filter may include a layer of a piezoelectric material such as aluminum nitride (AlN), enclosed between a bottom electrode and a top electrode, with a cavity provided around a portion of each electrode in order to allow a portion of the piezoelectric material to vibrate during operation of the filter. In some embodiments, an RF filter may be implemented as a plurality of RF filters, or a filter bank. A filter bank may include a plurality of RF resonators which may be coupled to a switch, e. g., the RF switch 2534, configured to selectively switch any one of the plurality of RF resonators on and off (i.e., activate any one of the plurality of RF resonators), in order to achieve desired filtering characteristics of the filter bank (i.e., in order to program the filter bank). For example, such a filter bank may be used to switch between different RF frequency ranges when the RF device 2500 is, or is included in, a BS or in a UE device. In another example, such a filter bank may be programmable to suppress TX leakage on the different duplex distances.

The impedance tuner 2532 may include any suitable circuitry, configured to match the input and output impedances of the different RF circuitries to minimize signal losses in the RF device 2500. For example, the impedance tuner 2532 may include an antenna impedance tuner. Being able to tune the impedance of the antenna 2502 may be particularly advantageous because antenna's impedance is a function of the environment that the RF device 2500 is in, e.g. antenna's impedance changes depending on, e.g., if the antenna is held in a hand, placed on a car roof, etc.

As described above, the RF switch 2534 may be used to selectively switch between a plurality of instances of any one of the components shown in FIG. 12, in order to achieve desired behavior and characteristics of the RF device 2500. For example, in some embodiments, an RF switch may be used to switch between different antennas 2502. In other embodiments, an RF switch may be used to switch between a plurality of RF resonators (e.g., by selectively switching RF resonators on and off) of any of the filters included in the RF device 2500.

In various embodiments, one or more of the III-N transistors as described herein may be particularly advantageous when used in any of the duplexer 2504, RX path amplifier 2512, RX path pre-mix filter 2514, RX path post-mix filter 2518, TX path amplifier 2522, TX path pre-mix filter 2528, TX path post-mix filter 2524, impedance tuner 2532, and/or RF switch 2534.

The RF device 2500 provides a simplified version and, in further embodiments, other components not specifically shown in FIG. 12 may be included. For example, the RX path of the RF device 2500 may include a current-to-voltage amplifier between the RX path mixer 2516 and the ADC 2520, which may be configured to amplify and convert the downconverted signals to voltage signals. In another example, the RX path of the RF device 2500 may include a balun transformer for generating balanced signals. In yet another example, the RF device 2500 may further include a clock generator, which may, e.g., include a suitable PLL, configured to receive a reference clock signal and use it to generate a different clock signal which may then be used for timing the operation of the ADC 2520, the DAC 2530, and/or which may also be used by the local oscillator 2506 to generate the local oscillator signals to be used in the RX path or the TX path.

SELECT EXAMPLES

The following paragraphs provide various examples of the embodiments disclosed herein.

Example 1 includes an integrated circuit (IC) structure, comprising a base structure comprising a III-N material, the base structure having a conductive region of a doped III-N material, a first contact element, including a first conductive element, a dielectric element, and a second conductive element, wherein the dielectric element is between the first conductive element and the second conductive element, and wherein the first conductive element is between the conductive region and the dielectric element, and a second contact element electrically coupled to the first contact element via the conductive region.

Example 2 includes the IC structure of example 1, wherein the doped III-N material comprises an n-type doped III-N material.

Example 3 includes the IC structure of example 1, wherein the dielectric element has a uniform thickness.

Example 4 includes the IC structure of example 1, wherein the dielectric element comprises one or more of a material including titanium and oxygen, a material including hafnium and oxygen, a material including silicon and nitrogen, or a material including silicon and oxygen.

Example 5 includes the IC structure of example 1, wherein the first conductive element comprises titanium nitride.

Example 6 includes the IC structure of example 1, wherein the conductive region is a first conductive region, wherein the base structure further has a polarization material and a second conductive region, wherein the polarization material extends from the first conductive region to the second conductive region, and wherein the second contact element is further electrically coupled to the first contact element via the polarization material and the second conductive region.

Example 7 includes the IC structure of example 6, wherein the polarization material includes aluminum, indium, gallium, or nitride.

Example 8 includes the IC structure of example 1, wherein the second contact element comprises a source contact or a drain contact of a transistor of the IC structure.

Example 9 includes the IC structure of example 1, wherein the IC structure comprises a front-end structure.

Example 10 includes an integrated circuit (IC) package, comprising an IC die, including a conductive region comprising doped III-N material, a first contact element, including a first conductive element, a dielectric element, and a second conductive element, wherein the dielectric element is between the first conductive element and the second conductive element, and wherein the first conductive element is between the conductive region and the dielectric element, and a second contact element, wherein the conductive region electrically couples the first contact element and the second contact element, and a further IC component coupled to the IC die.

Example 11 includes the IC package of example 10, wherein the second contact element comprises a source contact or a drain contact of a III-N transistor, and wherein the first conductive element, the dielectric element, and the second conductive element form a capacitive element that is coupled in series with the III-N transistor.

Example 12 includes the IC package of example 10, wherein the first contact element and the second contact element are separated by dielectric material.

Example 13 includes the IC package of example 10, wherein the conductive region is a first conductive region, wherein the IC die further includes a second conductive region comprising doped III-N material and a polarization material between the first conductive region and the second conductive region, and wherein the polarization material and the second conductive region further electrically couple the second contact element with the first contact element.

Example 14 includes the IC package of example 13, wherein the IC die further includes a III-N transistor, the III-N transistor comprising a source region, a drain region, and a gate stack, the second conductive region is the source region or the drain region of the III-N transistor, the polarization material is a first polarization material, the III-N transistor further includes a second polarization material between the second conductive region and the gate stack, and a thickness of the first polarization material is different from a thickness of the second polarization material.

Example 15 includes the IC package of example 10, wherein the dielectric element has a uniform thickness.

Example 16 includes the IC package of example 10, wherein the dielectric element comprises one or more of a material including titanium and oxygen, a material including hafnium and oxygen,
a material including silicon and nitrogen, or a material including silicon and oxygen.

Example 17 includes the IC package of example 10, wherein the further IC component includes one of a package substrate, an interposer, or a further IC die.

Example 18 includes an integrated circuit (IC) structure, comprising a base structure, a conductive region, a first contact element, including a dielectric element and a conductive element, wherein the dielectric element is between the conductive element and the conductive region, and a second contact element, wherein the conductive region extends from the first contact element to the second contact element, and wherein the base structure, the conductive region, the first contact element, and the second contact element are part of a front-end structure of the IC structure.

Example 19 includes the IC structure of example 18, wherein the dielectric element is between the first contact element and the second contact element, and wherein the dielectric element separates the second contact element and the first contact element.

Example 20 includes the IC structure of example 18, wherein the base structure comprises a III-N material.

Example 21 includes an integrated circuit (IC) structure, comprising a conductive region, a first contact element located on the conductive region, and a second contact element located on the conductive region, the second contact element including a conductive element and a dielectric region that separates the conductive element from the conductive region.

Example 22 includes the IC structure of example 21 or any other example, wherein the conductive region comprises a conductive layer that includes titanium or nitride.

Example 23 includes the IC structure of example 21 or any other example, wherein the conductive region comprises a doped III-N material.

Example 24 includes the IC structure of example 23 or any other example, wherein the doped III-N material comprises an n-type doped III-N material.

Example 25 includes the IC structure of example 21 or any other example, wherein the conductive region includes a first doped III-N region, a second doped III-N region that is separate from the first doped III-N region, and a polarization material that extends between the first doped III-N region and the second doped III-N region.

Example 26 includes the IC structure of example 25 or any other example, wherein the polarization material includes aluminum, indium, gallium, or nitride.

Example 27 includes the IC structure of example 21 or any other example, wherein the dielectric region of the second contact element abuts the conductive region.

Example 28 includes the IC structure of example 21 or any other example, wherein the dielectric region of the second contact element abuts the first contact element, and wherein the dielectric region separates the second contact element from the first contact element.

Example 29 includes the IC structure of example 21 or any other example, wherein the first contact element comprises a source or a drain of a transistor of the IC structure.

Example 30 includes the IC structure of example 21 or any other example, wherein the IC structure comprises a front-end structure.

Example 31 includes a method of integrating one or more passive components into an integrated circuit (IC) structure, comprising forming a conductive region within the IC structure, forming a first contact element on the conductive region, and forming a second contact element on the conductive region, forming the second contact element comprising forming a dielectric region on the conductive region and forming a conductive element on the dielectric region, wherein the dielectric region separates the conductive element from the conductive region.

Example 32 includes the method of example 31 or any other example, wherein forming the dielectric region includes applying a dielectric material via atomic layer deposition on the conductive region.

Example 33 includes the method of example 32 or any other example, wherein applying the dielectric material includes applying a uniform thickness of the dielectric material on the conductive region.

Example 34 includes the method of example 31 or any other example, wherein forming the conductive region includes doping a III-N material region of the IC structure to form a portion of the conductive region.

Example 35 includes the method of example 31 or any other example, wherein forming the conductive region includes doping a first portion of a III-N material region of the IC structure, doping a second portion of the III-N material region, the second portion being separate from the first portion, and forming a polarization material that extends between the first portion and the second portion, wherein the doped first portion, the doped second portion, and the polarization material form a portion of the conductive region.

Example 36 includes the method of example 31 or any other example, wherein forming the conductive region includes forming a conductive layer that extends between the first contact element and the second contact element, wherein the conductive layer includes titanium or nitride.

Example 37 includes an integrated circuit (IC) package, comprising an IC die, including a contact and a capacitive element that includes a dielectric region located within a contact element of the capacitive element, and a further IC component coupled to the IC die.

Example 38 includes the IC package of example 37 or any other example, wherein the contact is a first contact, and wherein the capacitive element further includes a second contact and a conductive region coupled to the first contact, wherein the conductive region is separated from the second contact by the dielectric region.

Example 39 includes the IC package of example 38 or any other example, wherein the conductive region includes a doped III-N region, and wherein the conductive region abuts a region of the first contact that includes titanium or nitride.

Example 40 includes the IC package of example 37 or any other example, wherein the further IC component includes one of a package substrate, an interposer, or a further IC die.

Example 41 includes one or more tangible, non-transitory computer-readable storage media having instructions stored thereon, wherein the instructions cause a device to perform operations of any of the examples 31-36.

Example 42 includes a method of producing the IC package of any of the examples 1-30 or the examples 37-40.

Example 43 includes an apparatus comprising means for performing the method of any of the examples 31-36.

Example 44 includes the apparatus of example 43, wherein the means comprise a processor and a memory.

Example 45 includes the apparatus of example 43, wherein the means comprise one or more tangible, non-transitory computer-readable storage media.

Example 46 includes the apparatus of example 43, wherein the apparatus is a computing device.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) structure, comprising:
   a base structure comprising a III-N material, the base structure having a conductive region of a doped III-N material;
   a capacitor, including:
      a first conductive element;
      a dielectric element; and
      a second conductive element, wherein the dielectric element is between the first conductive element and the second conductive element, and wherein the first conductive element is between the conductive region and the dielectric element;
   a contact element; and
   a resistor, the resistor comprising a conductive layer, wherein:
      the conductive layer has a first portion between the contact element and the base structure,
      the second conductive element is a second portion of the conductive layer,
      the first portion of the conductive layer and the second portion of the conductive layer are materially continuous portions of the conductive layer, and
      the contact element is electrically coupled to the capacitor via the conductive layer.

2. The IC structure of claim 1, wherein the doped III-N material comprises an n-type doped III-N material.

3. The IC structure of claim 1, wherein the dielectric element has a uniform thickness.

4. The IC structure of claim 1, wherein the dielectric element comprises one or more of:
   a material including titanium and oxygen,
   a material including hafnium and oxygen,
   a material including silicon and nitrogen, or
   a material including silicon and oxygen.

5. The IC structure of claim 1, wherein the first conductive element comprises titanium nitride.

6. The IC structure of claim 1, wherein the conductive region is a first conductive region, wherein the base structure further has a polarization material and a second conductive region, wherein the polarization material extends from the first conductive region to the second conductive region, and wherein the contact element is further electrically coupled to the capacitor via the polarization material and the second conductive region.

7. The IC structure of claim 6, wherein the polarization material includes aluminum, indium, gallium, or nitride.

8. The IC structure of claim 1, wherein the contact element comprises a source contact or a drain contact of a transistor of the IC structure.

9. The IC structure of claim 1, wherein the IC structure comprises a front-end structure.

10. The IC structure of claim 1, wherein:
    the base structure further includes a polarization material over the III-N material, and
    the conductive region of the doped III-N material is laterally adjacent to the polarization material and to the III-N material.

11. The IC structure of claim 1, wherein:
    the conductive region of the doped III-N material is a first conductive region of the doped III-N material,
    the base structure further includes a second conductive region of the doped III-N material and a polarization material,
    in a plane parallel to the base structure, the polarization material is between the first conductive region of the doped III-N material and the second conductive region of the doped III-N material.

12. The IC structure of claim 11, wherein, in a further plane parallel to the base structure, the III-N material is between the first conductive region of the doped III-N material and the second conductive region of the doped III-N material.

13. The IC structure of claim 11, wherein the polarization material is over the III-N material.

14. The IC structure of claim 1, wherein the dielectric element electrically separates the first conductive element and the second conductive element.

* * * * *